US010651097B2

(12) United States Patent
Sevillano et al.

(10) Patent No.: US 10,651,097 B2
(45) Date of Patent: May 12, 2020

(54) USING IDENTIFIERS TO MAP EDGE RING PART NUMBERS ONTO SLOT NUMBERS

(71) Applicant: Lam Research Corporation, Fremont, CA (US)

(72) Inventors: Evelio Sevillano, Danville, CA (US); Thomas Chang, Mountain View, CA (US); Robert O'Donnell, Fremont, CA (US); Ronda Ropes, Alameda, CA (US); Peter R. Wassei, Newberg, OR (US); Bridget Hill, Villach (AT)

(73) Assignee: Lam Research Corporation, Fremont, CA (US)

( * ) Notice: Subject to any disclaimer, the term of this patent is extended or adjusted under 35 U.S.C. 154(b) by 12 days.

(21) Appl. No.: 16/117,797

(22) Filed: Aug. 30, 2018

(65) Prior Publication Data

US 2020/0075430 A1    Mar. 5, 2020

(51) Int. Cl.
  *H01L 21/66*   (2006.01)
  *H01L 21/687*  (2006.01)
  *H01L 21/67*   (2006.01)

(52) U.S. Cl.
  CPC ........ *H01L 22/12* (2013.01); *H01L 21/67282* (2013.01); *H01L 21/67294* (2013.01); *H01L 21/68721* (2013.01); *H01L 22/26* (2013.01); *H01L 22/30* (2013.01)

(58) Field of Classification Search
  None
  See application file for complete search history.

(56) References Cited

U.S. PATENT DOCUMENTS

| 2004/0186622 | A1  |  9/2004 | Aiuchi et al. |
| 2017/0117170 | A1* |  4/2017 | Wong ............... H01L 21/67167 |
| 2017/0330786 | A1  | 11/2017 | Genetti et al. |
| 2018/0138069 | A1* |  5/2018 | Tan .......................... H01L 21/68 |

FOREIGN PATENT DOCUMENTS

| JP | 2011-209978 A    | 10/2011 |
| KR | 10-2005-0013378 A |  2/2005 |
| KR | 10-2018-0069190 A |  6/2018 |

OTHER PUBLICATIONS

ISR, PCT/US2019/045015, dated Nov. 20, 2019, 4 pages.

\* cited by examiner

*Primary Examiner* — Thien F Tran
(74) *Attorney, Agent, or Firm* — Penilla IP, APC

(57) ABSTRACT

Methods and systems for tracking an edge ring includes capturing an edge ring identifier from a source related to the edge ring. The edge ring is inserted into a slot of an edge ring carrier, wherein the edge ring is being assigned to the edge ring carrier. The edge ring identifier is tracked to determine transfers into and out of the edge ring carrier and into and out of a processing station. The tracking of the edge ring identifier builds a metadata file that provides lifetime information regarding the edge ring.

21 Claims, 17 Drawing Sheets

Table D: FORP State table

| FORP ID# | Type | Location | Stocker ID # | Current Route Status | Intended PMs | Intended Processes |
|---|---|---|---|---|---|---|
| 001 | Mixed ERs | S-087 | | Delivery completed at S-087. Leaving S-087 toward S-150 for delivery | S-050 thru S-099 | Etch |
| 002 | Mixed ERs | S-172 | | Enroute to S-172 for delivery | S-101 thru S-199 | Etch |
| 003 | Mixed ERs | S-120 | | Arrived at S-120 for exchange | S-101 thru S-150 | Etch |
| 004 | New ERs | | 72j | Queuing in stocker | S-101 thru S-150 | Etch |
| 005 | Mixed ERs | | 68s | Queuing in stocker | S-050 thru S-099 | Etch |
| 006 | Used ERs | S-99 | | Enroute to S-99 for pickup | S-70 thru S-99 | Metal Etch |
| 007 | New ERs | S-99 | | Scheduled for delivery to S-99 after used ER pickup | S-70 thru S-99 | Metal Etch |

Figure 9

Table A: content details of edge ring carrier, FORP001

| FORP001 content details | | | | | |
|---|---|---|---|---|---|
| FORP ID | Slot Number | Edge Ring ID | Lifetime used (in hrs) | Lifetime remaining (in hrs) | Process History |
| 001 | 1 | A-1 | 0 | 200 | MD: A-1 - metadata of ER A-1 |
| 001 | 2 | A-12 | 0 | 200 | MD: A-2 |
| 001 | 3 | Open | - | - | MD: ---- |
| 001 | 4 | B-11 | 0 | 200 | MD: B-11 |
| 001 | 5 | B-2 | 0 | 200 | MD: B-2 |
| 001 | 6 | D-18 | 0 | 200 | MD: D-18 |
| 001 | 7 | Open | - | - | MD: ---- |
| 001 | 8 | Open | - | - | MD: ---- |
| 001 | 9 | F-2 | 195 | 5 | MD: F-2 |
| 001 | 10 | F-3 | 188 | 12 | MD: F-3 |
| 001 | 11 | F-18 | 156 | 44 | MD: F-18 |
| 001 | 12 | A-32 | 204 | 0 | MD: A-32 |
| | Carrier Plate | Present | | | -- |

Figure 10

Table B: Metadata of Edge ring A-1:

| MD: A-1 - See Table C for ER routing history | | | |
|---|---|---|---|
| Time (in hrs) | Process | Processing Station | Process Module ID |
| 0-15 | Etch 1 | S-087 | PM-01X1 |
| 16-30 | Etch 2 | S-087 | PM-01X3 |
| 31-70 | Etch 3 | S-172 | PM-07Y3 |
| 71-80 | Etch 4 | S-172 | PM-27X5 |
| 81-130 | Etch 5 | S-120 | PM-12W4 |
| 131-180 | Etch 6 | S-120 | PM-12W5 |

Figure 11

Table C: ER routing history of ER A-1 (through FORPS)

ER Routing History: A-1

| Time | Delivery mode | Status | Processing station | PM ID | Process |
|---|---|---|---|---|---|
| 0 | FORP001 | Loaded/delivered | S-087 | | |
| 0 | ATM/VTM robot | Delivered | S-087 | PM-01X 1 | Etch 1 (0-15 hrs) |
| 16 | VTM robot | Removed | S-087 | PM-01X 1 | |
| 16 | VTM robot | Inserted | S-087 | PM-01X 3 | Etch 2 (16-30 hrs) |
| 31 | VTM/ATM robot | Removed | S-087 | PM-01X 3 | |
| 31 | FORP002 | Loaded/delivered | S-172 | | |
| 31 | ATM/VTM robot | Delivered | S-172 | PM-07Y 3 | Etch 3 (31-70 hrs) |
| 71 | VTM robot | Removed | S-172 | PM-07Y 3 | |
| 71 | VTM robot | Inserted | S-172 | PM-27X 5 | Etch 4 (71-80 hrs) |
| 81 | VTM/ATM robot | Removed | S-172 | PM-27X 5 | |
| 81 | FORP003 | Loaded/delivered | S-120 | | |
| 81 | ATM/VTM robot | Delivered | S-120 | PM-12W 4 | Etch 5 (80-130 hrs) |
| 131 | VTM robot | Removed | S-120 | PM-12W 4 | |
| 131 | VTM robot | Inserted | S-120 | PM-12W 5 | Etch 6 (131-180 hrs) |

Figure 12

Table A: FORP ID 001 content details

FORP001 content details - see Table D for FORP001 state

| FORP ID | Slot Number | Edge Ring ID | Lifetime used (in hrs) | Lifetime remaining (in hrs) | Process History |
|---|---|---|---|---|---|
| 001 | 1 | A-1 | 0 | 200 | MD: A-1 - see Table B for metadata of ER A-1 |
| 001 | 2 | A-12 | 0 | 200 | MD: A-2 |
| 001 | 3 | Open | - | - | MD: --- |
| 001 | 4 | B-11 | 0 | 200 | MD: B-11 |
| 001 | 5 | B-2 | 0 | 200 | MD: B-2 |
| 001 | 6 | D-18 | 0 | 200 | MD: D-18 |
| 001 | 7 | Open | - | - | MD: --- |
| 001 | 8 | Open | - | - | MD: --- |
| 001 | 9 | F-2 | 195 | - | MD: F-2 |
| 001 | 10 | F-3 | 188 | 12 | MD: F-3 |
| 001 | 11 | F-18 | 156 | 44 | MD: F-18 |
| 001 | 12 | A-32 | 204 | 0 | MD: A-32 |
| | Carrier Plate | Present | | | --- |

Figure 13

Table A: FORP002 content details

| FORP002 content details - see Table D for FORP002 state | | | | | |
|---|---|---|---|---|---|
| FORP ID | Slot Number | Edge Ring ID | Lifetime used (in hrs) | Lifetime remaining (in hrs) | Process History |
| 002 | 1 | B-1 | 0 | 200 | MD: B-1 |
| 002 | 2 | B-12 | 0 | 200 | MD: B-12 |
| 002 | 3 | Open | - | - | MD: --- |
| 002 | 4 | B-14 | 0 | 200 | MD: B-14 |
| 002 | 5 | A-1 | 30 | 170 | MD: A-1 - See Table B for metadata of ER A-1 |
| 002 | 6 | B-28 | 0 | 200 | MD: B-28 |
| 002 | 7 | B-18 | 20 | 180 | MD: B-18 |
| 002 | 8 | B-17 | 170 | 30 | MD: B-17 |
| 002 | 9 | Open | - | - | MD: --- |
| 002 | 10 | B-23 | 188 | 12 | MD: B-23 |
| 002 | 11 | A-59 | 190 | 10 | MD: A-59 |
| 002 | 12 | Open | - | - | MD: --- |
| | Carrier Plate | Present | | | -- |

Figure 14

Table A: FORP003 content details

| FORP003 content details - see Table D for FORP003 state | | | | | |
|---|---|---|---|---|---|
| FORP ID | Slot Number | Edge Ring ID | Lifetime used (in hrs) | Lifetime remaining (in hrs) | Process History |
| 003 | 1 | D-1 | 40 | 200 | MD: D-1 |
| 003 | 2 | D-12 | 50 | 150 | MD: D-12 |
| 003 | 3 | B-65 | 70 | 130 | MD: B-65 |
| 003 | 4 | B-13 | 0 | 200 | MD: B-13 |
| 003 | 5 | C-1 | 30 | 170 | MD: C-1 |
| 003 | 6 | C-28 | 110 | 90 | MD: C-28 |
| 003 | 7 | B-27 | 0 | 200 | MD: B-27 |
| 003 | 8 | A-1 | 80 | 120 | MD: A-1 - See Table B for metadata of ER -1 |
| 003 | 9 | A-37 | 35 | 165 | MD: A-37 |
| 003 | 10 | D-39 | 188 | 12 | MD: D-39 |
| 003 | 11 | Open | - | - | MD: --- |
| 003 | 12 | Open | - | - | MD: --- |
| | Carrier Plate | Present | | | --- |

Figure 15

Table B: Metadata of Edge ring A-1:

MD: A-1 - See Table C for ER routing history

| Time (in hrs) | Process | Processing Station | Process Module ID |
|---|---|---|---|
| 0-15 | Etch 1 | S-087 | PM-01X1 |
| 16-30 | Etch 2 | S-087 | PM-01X3 |
| 31-70 | Etch 3 | S-172 | PM-07Y3 |
| 71-80 | Etch 4 | S-172 | PM-27X5 |
| 81-130 | Etch 5 | S-120 | PM-12W4 |
| 131-180 | Etch 6 | S-120 | PM-12W5 |

Figure 16

Table D: FORP State table

| FORP ID# | Type | Location | Stocker ID# | Current route Status | Intended PMs | Intended processes |
|---|---|---|---|---|---|---|
| 001 | Mixed ERs | S-087 | | Delivery completed at S-087. Enroute to S-150 for delivery | S-050 thru S-099 | Etch |
| 002 | Mixed ERs | S-172 | | delivered to S-172 | S-101 thru S-199 | Etch |
| 003 | Mixed ERs | S-120 | | 1 ER exchange complete. Waiting for second ER exchange | S-101 thru S-150 | Etch |
| 004 | New ERs | | 72j | Queuing in stocker | S-101 thru S-150 | Etch |
| 005 | Mixed ERs | | 68s | Queuing in stocker | S-050 thru S-099 | Etch |
| 006 | Used ERs | S-99 | | Enroute to S-99 for pickup | S-70 thru S-99 | Metal etch |
| 007 | New ERs | S-99 | | scheduled for delivery to S-99 after used ER pickup | S-70 thru S-99 | Metal etch |

Figure 17

USING IDENTIFIERS TO MAP EDGE RING PART NUMBERS ONTO SLOT NUMBERS

FIELD OF THE DISCLOSURE

The present embodiments relate to semiconductor wafer processing, and more particularly, to tracking and verifying that correct consumable parts are provided to a process module.

DESCRIPTION OF THE RELATED ART

A typical fabrication system includes a plurality of cluster tool assemblies or processing stations. Each processing station used in the manufacturing process of a semiconductor wafer includes one or more process modules with each process module used to perform a specific manufacturing operation. Some of the manufacturing operations performed within the different process modules include, a cleaning operation, an etching operation, a deposition operation, a rinsing operation, a drying operation, etc. The process chemistries and process conditions used in the process modules to perform these operations cause damage to some of the hardware components that are constantly exposed to the harsh conditions within the process modules. These damaged or worn out hardware components need to be replaced periodically and promptly to ensure that the damaged hardware components do not expose other hardware components in the process modules to the harsh conditions, and to ensure quality of the semiconductor wafer. For example, an edge ring that is disposed adjacent to a semiconductor wafer within a process module may get damaged due to its location and continuous exposure to ion bombardment from plasma generated within the process module that is used in an etching operation. The damaged edge ring needs to be replaced promptly to ensure that the damaged edge ring does not expose the underlying hardware components, such as a chuck, to the harsh process conditions. The hardware components that can be replaced are referred to herein as consumable parts.

Consumable parts, such as edge rings, are highly critical to process performance. These consumable parts are typically replaced manually and require venting of the process module for exchanging the edge ring. Alternately, the consumable parts are replaced using an automated approach involving loading new edge rings into a carrier (e.g., a FORP (front opening ring pod) that is similar to a Front Opening Unified Pod (FOUP) used for wafer transportation/exchange), transporting the FORP to a load port of a processing station, and using the system robotics to remove an old edge ring from a process module and install a new edge ring. The replacement of the consumable parts is performed under vacuum in a manner similar to the transport of a wafer to and from a process module. The carrier can be transported manually or through a fab automated material handling system (AMHS) that is used for transporting wafer FOUPs. A single carrier may be used to store both new edge rings and worn out edge rings that are removed from the process module or different carriers may be used for separately storing new edge rings and used edge rings. Worn out rings need to be promptly disposed of and when entirely used up, new rings need to be loaded.

The exact shape and height of an edge ring is optimized based on the process application. As a result, there is a multitude of different edge rings that are in use and need to be efficiently managed. The differences in the different types of edge rings are often very slight and imperceptible to the eye. Furthermore, once in the carrier, it becomes nearly impossible to distinguish among different edge rings. In a production environment, the edge ring carriers could contain a single type of edge rings, more than one type of edge rings, or edge rings of a single type or multiple types mixed with other consumable parts. Care should be taken to ensure that worn out edge rings are not returned to a process module, or a carrier with incorrect edge rings are not loaded to the wrong processing station. An incorrect edge ring accidentally loaded to a process module would lead to wafer scrap events that are unacceptable. Such issues may go undetected for a considerable length of time and may significantly affect the quality of the wafers that are being processed, thereby severely impacting the profit margin for a semiconductor manufacturer. Currently, there is no efficient way to automatically verify that the correct edge rings are being loaded into the FORP or to determine their location (i.e., slot number) in the FORP.

It is in this context that embodiments of the invention arise.

SUMMARY

Embodiments of the disclosure include systems and methods for tracking an edge ring throughout its lifetime starting from the moment it is inserted into a carrier, such as a front opening ring pod (FORP) (similar to a wafer carrier—front opening unified pod (FOUP)), through a fabrication system, and back to a FORP. The edge ring is tracked within the entire fabrication facility till a useful life of the edge ring is spent, when it is targeted for disposal. The fabrication facility includes a plurality of processing stations serviced by an automated material handling system. The processing station is where one or more fabrication operations are performed. As a result, the processing station is also referred to herein as a "fabrication system". Each processing station may include one or more process modules, which use a particular type of edge ring, based on the process that is performed within. The process modules are designed to replace worn out consumable parts, such as edge rings, damaged during wafer processing, and such replacements are done in-situ without opening the process modules for wet cleans. The edge rings are replaced under vacuum in a manner similar to the way a wafer is transported within the process module. New edge rings for replacement are brought to the processing stations in an edge ring carrier (e.g., FORP), similar to a wafer front opening unified pod (FOUP). The edge ring carrier can be manually delivered or can be brought to the processing stations by an automated material handling system (AMHS) employed within the fabrication facility, which is typically used for transferring wafer FOUPs.

Different process modules within different processing stations may use different types of edge rings. The different types of edge rings may vary slightly or considerably from one to the other. It is important to keep track of the different types of edge rings used in the different process modules and deliver a correct type of edge ring to each process module within different processing stations in order to optimize the processes performed therein. The fabrication facility employs a plurality of edge ring carriers for delivering and removing edge rings from different process modules within one or more processing stations (i.e., fabrication systems). When an edge ring needs to be replaced within a process module of a processing station, a new edge ring that is appropriate for the process module is identified and loaded on to an appropriate edge ring carrier. The edge ring carrier with the appropriate new edge ring is moved to a load port of the processing station that includes the process module, for delivery of the edge ring.

The various implementations ensure delivery of correct edge rings to the processing station, by identifying and tracking the edge rings using edge ring identifiers. The edge rings are tracked from a time they are loaded into the FORP and then brought into the fabrication facility (otherwise referred to as "fab") as a new edge ring up till the end of its lifecycle. The information from the tracking of the edge ring within the fabrication facility is used to build a metadata file that provides lifetime information of the edge ring. Keeping track of each edge ring ensures that the correct edge rings with sufficient lifetime availability are delivered to each process module, thereby eliminating any loading errors (e.g., avoiding incorrect edge ring or used edge rings with insufficient lifetime left, from being loaded into a process module). The edge rings are tracked at multiple levels. For instance, the edge rings are tracked when they are loaded into the edge ring carrier by linking an edge ring identifier of an edge ring to a carrier identifier of the edge ring carrier and a slot number of a slot within the edge ring carrier into which the edge ring is loaded. This linking allows a tracking system to keep track of the location of the various edge rings within different edge ring carriers as they are moved inside the fab and then loaded into the fabrication system. Further tracking of the edge rings is done at the processing tool (i.e., a processing station or fabrication system) level within the fabrication facility, when the edge ring is delivered to the processing station. The tracking at the processing tool level is done by the tool control system, or alternatively by querying a module, such as a manufacturing execution system, executing on a server in the fabrication facility. Tracking at the process tool level is to make sure that the correct edge ring with sufficient leftover life time is being delivered to a process module within the processing station. The multi-level tracking ensures that used edge rings or incorrect edge rings are not erroneously loaded into a process module, thus avoiding unnecessary wafer scraps from such errors. The tracking also ensures that the edge ring carrier includes the correct edge rings that are intended for a particular process module.

In one implementation, a method for tracking an edge ring is disclosed. The method includes capturing an edge ring identifier from a source, wherein the source may be a packing material of the edge ring or a surface of the edge ring or an item embedded in the edge ring. The ring identifier information can be used to authenticate rings, information that can later be used within the processing station. The edge ring is inserted into a slot of an edge ring carrier, wherein the edge ring is being assigned to the edge ring carrier. The edge ring identifier is tracked to keep track of transfers into and out of the edge ring carrier and into and out of a processing station. The tracking of the edge ring identifier builds a metadata file that provides lifetime information regarding the edge ring.

In some implementations, inserting the edge ring includes linking the edge ring identifier to a slot identifier of the slot and to a carrier identifier of the edge ring carrier.

In some implementations, the capturing and inserting operations are performed during a time when the edge ring is being loaded to the edge ring carrier.

In some implementations, the tracking of the edge ring identifier includes receiving information captured by one or more sensors of the edge ring carrier as the edge ring is moved into and out of a specific slot of the edge ring carrier. The information received from the one or more sensors is used to update the lifetime information in the metadata file of the edge ring.

In some implementations, the information received from the one or more sensors of the edge ring carrier are used to update a content table maintained for the edge ring carrier.

In some implementations, the tracking of the edge ring identifier includes receiving information captured by one or more sensors distributed within the processing station as the edge ring moves within the processing station of a fabrication facility. The information received from the one or more sensors is used to update the lifetime information in the metadata file of the edge ring.

In some implementations, the processing station includes at least a load port, an atmospheric transfer module, a loadlock chamber, a vacuum transfer module, a process module in which the edge ring is to be used, and one or more robots that move the edge ring within the processing station. The information received from the one or more sensors distributed within the processing station includes one or more of a location of the edge ring, a time when the edge ring is introduced into the location, a time when the edge ring is removed from the location, a condition of the edge ring before moving to the location, the condition of the edge ring after moving out of the location, an intended process of use for the edge ring, an intended process module of use for the edge ring, or an usage record of the edge ring within the process module.

One advantage of tracking the edge ring is to know a location of the edge ring at all times and also a condition of the edge ring as the edge ring progresses through the fab and its fabrication systems. The location and condition information provide a history of usage of the edge ring within the fabrication facility so that a correct edge ring is delivered to a process module, when needed. These and other advantages will be discussed below and will be appreciated by those skilled in the art upon reading the specification, drawings and the claims.

BRIEF DESCRIPTION OF THE DRAWINGS

FIG. 9 illustrates an example FORP (i.e., edge ring carrier) State Table (Table D), in accordance with one embodiment.

FIG. 10 illustrates an example Table A providing content details of an edge ring carrier, FORP001, in accordance with one embodiment.

FIG. 11 illustrates an example Table B providing details of metadata maintained for an edge ring A-1, in accordance with one embodiment.

FIG. 12 illustrates an example Table C that captures details of routing history of an edge ring A-1, in accordance with one embodiment.

FIG. 13 illustrates an example Table A providing content details of edge ring carrier FORP001, which is similar to the details provided in FIG. 10, in accordance with one embodiment.

FIG. 14 illustrates an example Table A providing content details of edge ring carrier FORP002, in accordance with one embodiment.

FIG. 15 illustrates an example Table A providing content details of edge ring carrier FORP003, in accordance with one embodiment.

FIG. 16 illustrates an example Table B providing details of metadata of edge ring A-1 with internal links, wherein the details are similar to Table B illustrated in FIG. 11, in accordance with one embodiment.

FIG. 17 illustrates an example Table D providing details of FORP state table, in accordance with one embodiment.

DETAILED DESCRIPTION

In the following description, numerous specific details are set forth in order to provide a thorough understanding of the present inventive features. It will be apparent, however, to one skilled in the art that the present invention may be practiced without some or all of these specific details. In other instances, well known process operations have not been described in detail in order not to unnecessarily obscure the present invention.

Embodiments of the disclosure provide details of tracking an edge ring using an edge ring identifier and building metadata file for the edge ring based on the tracking. When a new edge ring is first introduced into the fabrication facility, an edge ring identifier is scanned and the edge ring is loaded onto an edge ring carrier for onward transmission to a processing station (fabrication system). The tracking of the edge ring identifier provides information with regards to a current status of the edge ring within the fab and its fabrication systems. Information from the tracking of the edge ring is updated to a metadata file of the edge ring. As the edge ring progresses through one or more processing stations, sensors distributed within the one or more processing stations are used to collect additional information about the edge ring. The additional information obtained from tracking of the edge ring provides a current location, a current condition and usage history of the edge ring within the fabrication system. The usage history of the edge ring includes details of lifetime hours used within the process modules and the lifetime hours remaining. The additional information is updated to the metadata file maintained for the edge ring so as to build lifetime information (i.e., usage history) of the edge ring. The tracking of the edge ring begins from the time when the edge ring is introduced into the FORP as a new edge ring, and continues throughout its lifetime to capture details of the movement of the edge ring through the various fabrication systems. This tracking helps in determining when a particular edge ring needs to be replaced within a process module, which edge ring to replace with, etc. With the above general understanding of the implementation, various specific details will now be described with reference to the various drawings.

Figure 1:
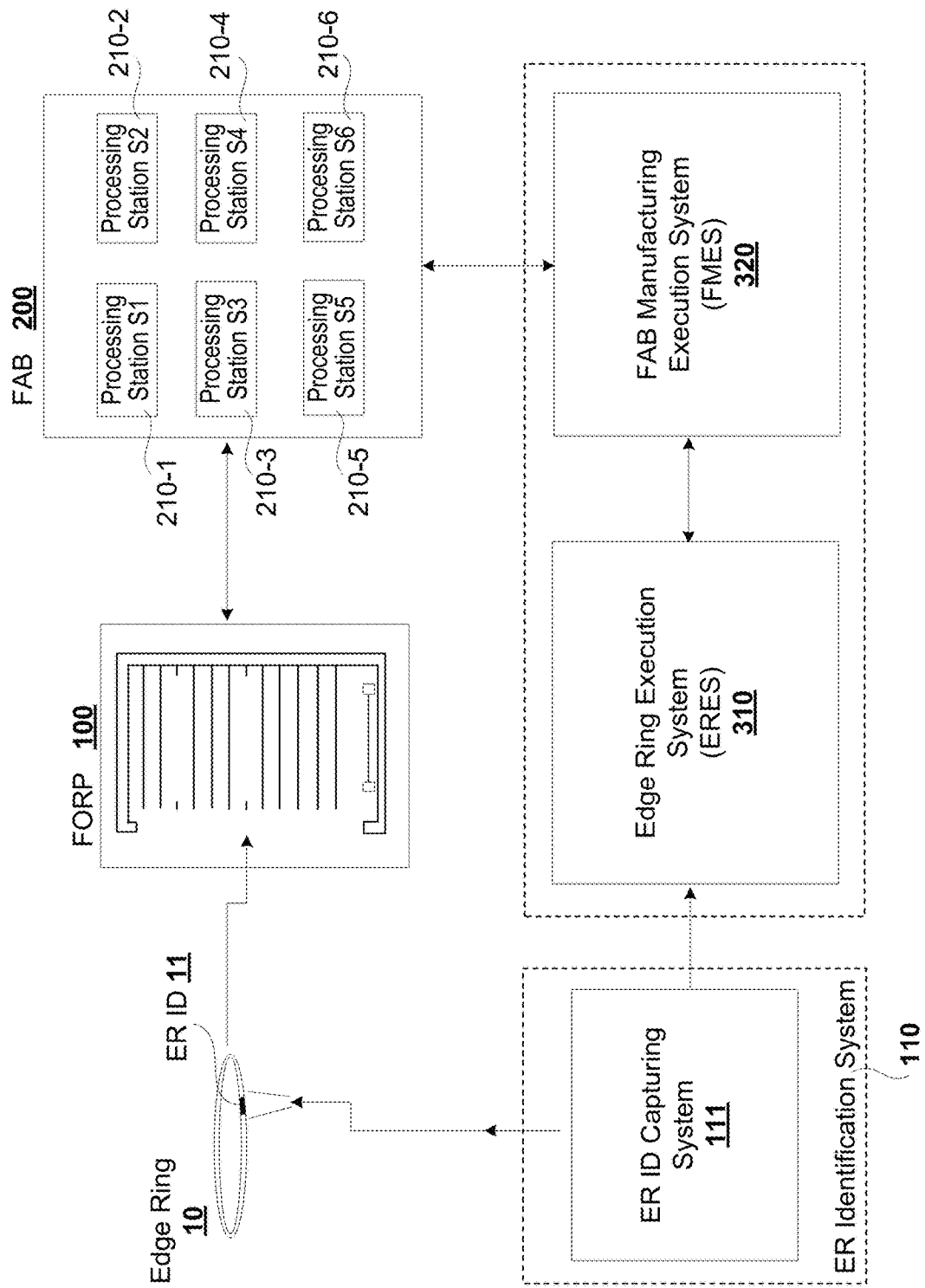
FIG. 1 illustrates a simplified block diagram of a fabrication system that employs an edge ring execution system used in tracking an edge ring, in one implementation.

FIG. 1 illustrates a simplified block diagram of an overall fabrication facility 200 in which edge rings used within various process modules are tracked, in one implementation. When a new edge ring 10 is received, the edge ring is loaded onto a FORP 100. During loading, an edge ring identifier (ER ID) 11 of the edge ring 10 is captured by an edge ring (ER) identification system 110. The ER identification system 110 may use an ER ID capturing system 111 to capture the ER ID 11. The edge ring identifier may be in the form of a combination of alphabetic characters, numeric characters or alpha-numeric characters, a bar code, an RFID tag, an image, a QR (quick response) code, a label, a dimple or other visual marking or icon, a notch, an infra-red marking, a two-dimensional barcode, or any other form of identification provided on a package of the edge ring or on a surface of the edge ring that does not deteriorate or get adversely affected over time when exposed to the processing conditions in the process modules. In the case where the edge ring identifier is provided on the surface, the edge ring identifier may be provided on an underside surface of the edge ring or on an outer side surface of the edge ring. Alternately, the edge ring identifier may be provided below a surface of the edge ring (e.g., a chip embedded within the edge ring). Depending on the type of edge ring identifier, the ER ID capturing system may employ any one of a plurality of sensors/readers to obtain the edge ring identifier. For example, a camera or an image capturing device may be used to capture an image of the ER ID. Additionally, if needed, an optical character recognition (OCR) software may be used to extract any textual content captured in the image. Alternately, a bar code reader or an RFID reader or a sensor or any other capturing or detecting device may be used to capture the edge ring identifier.

The received edge ring is placed into an edge ring carrier (e.g., front opening ring pod—FORP) 100 and transported to a processing station (e.g., any one of processing stations 210-1 through 210-6) within the fabrication facility 200 for supplying to a process module. Meanwhile, the edge ring identifier captured by the ER identification system 110 is transmitted to an edge ring execution system (ERES) 310, which processes the edge ring identifier, including decrypting the identifier (if the ER ID is encrypted), and generating a metadata file for the edge ring using the edge ring identifier. The edge ring identifier of the edge ring is used to query a manufacturing execution system 320 executing on a server in the fabrication facility (FAB MES or simply FMES), which keeps track of all the different parts that are used and/or processed within the fabrication facility 200, to obtain additional information that is used to define usage history of the edge ring.

As the edge ring is being used within the fabrication facility, one or more sensors distributed throughout the fabrication facility track the edge ring using the edge ring identifier. For example, sensors may be provided within the FORP 100, along the automated material handling system (AMHS) that delivers the edge ring carrier 100 to the different processing stations, and within the processing stations S1-S6 to track the edge ring in order to determine a location and condition of the edge ring. Information captured of the edge ring, by the sensors, is passed on to the ERES 310 for updating different process tables. The information passed by the sensors may include details of the edge ring within the fabrication system. In addition to the edge ring details obtained by tracking the edge ring identifier of the edge ring, additional details about the different types of edge rings that are being used in the different process modules may also be obtained by querying the FMES 320. The information returned by the FMES 320 is used by the edge ring execution engine 310 to update the metadata file of the edge ring 10. The updates to the metadata file of the edge ring provides the usage history of the edge ring, including various locations the edge ring has traveled within the fabrication system, a current location of the edge ring, different processes the edge ring was exposed to within the different process modules into which the edge ring was inserted, current condition of the edge ring and other lifetime details.

The usage history may be used to determine when the edge rings delivered to different process modules are nearing their end-of-life use and have to be replaced. Tracking of the edge ring allows automatic identification of a design of the edge ring, location of the edge ring in the fabrication system, and verification that the correct edge ring is delivered to and installed in the process modules. The various implementations ensure that the edge ring with the correct design is targeted for a particular process module and has sufficient remaining life for performing one or more processes scheduled at the particular process module.

The tracking of an edge ring can be broken down into two main elements. The first element is when the edge ring is newly introduced into the fabrication system and the second element is when the edge ring is being used in processing station(s) (fabrication system(s)).

Figure 2:
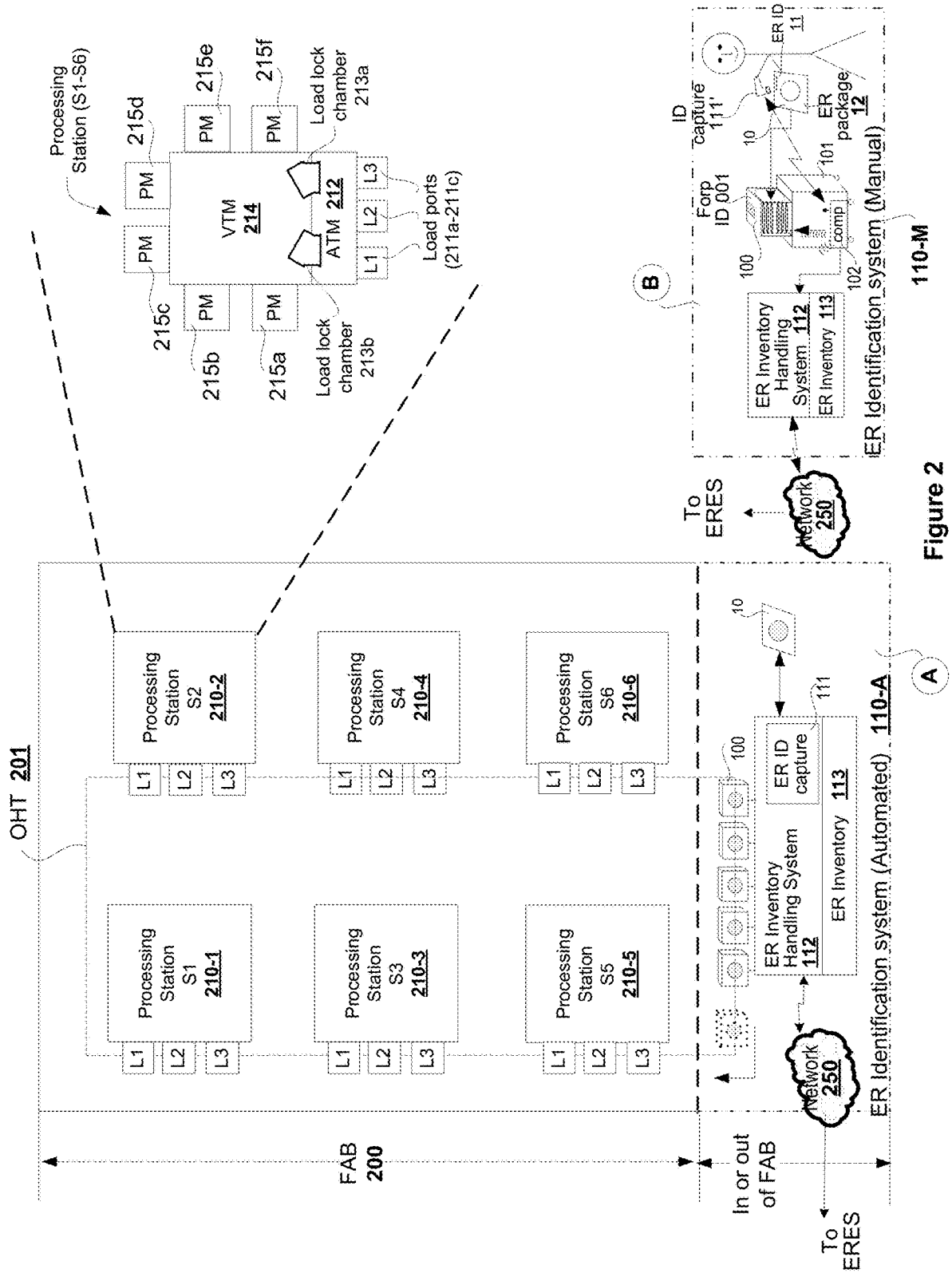
FIG. 2 illustrates a simplified edge ring capturing system that is communicatively connected to a fabrication system to keep track of an edge ring, in one implementation.

FIG. 2 illustrates the first element involved in the process of tracking the edge ring within a fabrication facility 200, in one implementation. The edge ring may be introduced into the fabrication facility 200 by an automated process or a manual process.

In the automated process, a new edge ring 10 is received into and processed by an ER ID capturing system 110-A. An edge ring identifier may be provided on a surface (an underside surface or an outer side surface) of an edge ring or embedded within the edge ring. Alternately, the edge ring identifier may be provided on a package of the edge ring. The edge ring (ER) is processed via the ER inventory handling system 112. The ER inventory handling system may be executing on a server of a computer at a receiving station or at a location within or outside the fabrication facility 200 where the new edge rings are being received. The ER inventory handling system 112 includes an ER ID capturing device 111 (e.g., a sensor, an image capturing device, a reader, etc.,) to capture the edge ring identifier and other relevant information that are provided on the edge ring surface, embedded within the edge ring or on the package. For example, the other relevant information may include a type of edge ring, an intended process, lifetime use hours, etc. The captured information of the edge ring is processed by the ER inventory handling system 112 to generate a unique, encrypted code for the edge ring that includes the edge ring identifier (e.g., a serial number or other encrypted information).

As part of processing the captured information, the ER inventory handling system 112 may authenticate the edge ring that is being loaded is a valid edge ring that is used within the fabrication facility 200, in one implementation. As part of authenticating the edge ring, the ER inventory handling system 112 may query a FAB manufacturing execution system 320 over a network to obtain information on the different types of edge rings that are used in the various processing stations within the fabrication facility 200. The ER inventory handling system 112 may then verify the type of edge ring that is being loaded against the information obtained from the FAB manufacturing execution system 320 to determine if the edge ring that is being loaded is a valid one. If the edge ring is not of the type that is used in the fabrication facility, a signal may be generated by the ER inventory handling system 112 to indicate that an inappropriate or incorrect edge ring is being introduced into the fabrication facility. In response to the signal, the ER inventory handling system 112 ensures that the incorrect edge ring is not loaded on to the FORP for onward transmission to the fabrication facility. On the other hand, if the edge ring is of a type that is used in one or more process modules within the fabrication facility, the unique, encrypted code is generated for the edge ring. Thus, the ER inventory handling system 112 acts as a virtual sentinel to ensure that only valid edge rings are loaded onto the FORP that supplies edge rings to the processing stations within the fabrication facility.

Upon generating the encrypted code, the relevant information and the encrypted code of the edge ring is updated to an ER inventory (113) that maintains all the edge rings that have been successfully processed by the ER inventory handling system 112. In addition to processing the ER identifier of the edge ring, the ER inventory handling system 112 may identify an edge ring carrier into which the edge ring is to be loaded for onward transmission to different processing stations. In some implementations, certain ones of the edge ring carriers may store edge rings that can be used for specific processes (e.g., dielectric etch process, metal etch process, a wet etch, a dry etch, etc.). In such implementations, the ER inventory handling system 112 may identify and load edge rings that are to be used for specific processes onto a specific edge ring carrier. In alternate implementations, the edge ring may be loaded onto any edge ring carrier 100 that is available to the ER inventory handling system 112. The loaded edge ring carrier 100 are then transported to different processing stations within the fabrication facility 200 using an automated material handling system (AMHS), such as an overhead transport vehicle (OHT) 201. The OHT vehicle 201 may be one form of material handling system employed by the AMHS and that other forms of material handling system used for transferring FOUPs, such as conveyor belts, a buffer store, etc., may also be employed. In some implementations, the OHT may be part of a bigger automated material handling system, wherein the OHT may be used to drop the edge ring carrier onto a conveyor belt, or to a load port or to a buffer store or to a stocker and a robot or other automated handler may be used to move the edge ring carrier from the conveyor belt, buffer store, stocker, etc., to a load port of a processing station.

The fabrication facility may include a plurality of processing stations (i.e., fabrication systems). An example fabrication system shown in FIG. 2 includes six processing stations S1-S6 (210-1 through 210-6). The number of processing stations shown in FIG. 2 is just an example, and that a typical fabrication system may include tens or hundreds of processing stations. Each processing station may include one or a plurality of load ports (load ports L1-L3 are shown as examples) on which the edge ring carriers as well as wafer carriers are received for exchanging edge rings and wafers. In an example illustrated in FIG. 2, each processing station (S1-S6) includes a plurality of load ports 211a-211c, an atmospheric transfer module (ATM) 212, a pair of loadlock chambers 213a, 213b, disposed between the ATM 212 and a vacuum transfer module (VTM) 214 and a plurality of process modules 215a-215f distributed symmetrically around the VTM 214. In alternate implementations, the plurality of process modules 215a-215f may be distributed non-symmetrically around the VTM 214. In alternate implementations, the processing station may include fewer or greater number of load ports, fewer or greater number of process modules, one or more than two loadlock chambers. Robots (not shown) are provided within the ATM 212, and the VTM 214 to transport the edge rings and wafers into and out of the different process modules.

The ER inventory handling system 112 is executed on a server computing device that is at a location where new edge rings are being received for onward transmission to processing stations of the fabrication facility 200. The server computing device may be part of the fabrication facility 200 or located outside of the fabrication facility but communicatively connected to an ER execution system (ERES) to enable transmission of edge ring information to the ERES. For example, the unique, encrypted code identifying the edge ring identifier and other relevant information of the edge ring is communicated by the ER inventory handling system 112 to the ERES, over a network 250, such as an Internet, Intranet, virtual private network, etc. In some implementations, the ERES may be executing on a computer that is within the fabrication facility 200. In other implementations, the ERES may be executing on a cloud server and communicatively connected to the ER identification system 110 and to other system(s) through the network 250. The information related to the edge ring are used in further tracking the edge ring as the edge ring is transferred into and out of the edge ring carrier and into and out of the processing stations within the fabrication facility 200. The tracking information is updated to a metadata file for the edge ring, which provides usage history of the edge ring from a time the edge ring is entered into the ER inventory handling system 112 till a time the edge ring exits the fabrication facility.

In the manual process, a user manually scans a new edge ring that is received in the fabrication facility and provides the information to different modules within an ER identification system 110-M for processing. Scanning the new edge ring includes scanning an edge ring identifier 11 via a sensor, a reader or any other capturing device 111'. The edge ring identifier 11 may be provided as a tag (e.g., having alphabetic characters, numeric characters, alpha-numeric characters, RFID, etc.) on the surface of the edge ring or on a package of the edge ring or embedded as a chip within the edge ring. In addition to the edge ring identifier 11, the capturing device also captures other relevant information of the edge ring, including a type of edge ring, an intended process, lifetime use hours, etc., that is provided with the identifier. The capturing device 111' may be communicatively connected to a computer 102 on a cart 101 through wired or wireless means, and the information captured by the capturing device 111' is transmitted to the computer 102 by the capturing device. The computer 102 validates the edge ring to ensure that the edge ring that is received is a valid edge ring that is used in the fabrication facility, prior to generating a unique, encrypted code for the edge ring identifier. Upon successful validation, the edge ring is inserted into an open slot of an edge ring carrier 100 that is received on the cart 101. The edge ring carrier 100 includes a plurality of slots that are oriented vertically, with each slot identified using a slot number. In some implementations, the slot number of the edge ring is manually entered by the user into the computer as soon as the user loads the edge ring into an open slot. Alternately, the user may use the capturing device that is used to capture the edge ring identifier to capture a slot number of the slot into which the edge ring is loaded manually by the user. In some alternate implementations, sensors may be provided within the edge ring carrier to verify the information that was manually provided by the user (e.g., the slot number of the slot into which the edge ring is inserted), prior to the information being transmitted to the computer 102. During the verification, when the information provided by the user does not match with what was detected by the sensors (e.g., mismatch in the slot number) within the edge ring carrier, an alarm may be generated to warn the user of the mismatch. In such a case, the information related to the edge ring identifier and the slot number of the edge ring may be communicated to the computer 102 after the detected error (i.e., mismatch) has been corrected.

In some implementation, the computer 102 is configured to communicate with a tag of the edge ring carrier to verify the carrier identifier of the edge ring carrier captured by the capturing device 111' and upon successful verification, link the information of the edge ring carrier with the information related to the edge ring. An ER inventory handling system 112 executing in the computer 102 is used to link the carrier identifier of the edge ring carrier with the edge ring identifier, the slot number associated with the edge ring to generate a unique, encrypted code. The information related to the edge ring and the encrypted code of the edge ring is updated to an ER inventory 113 that is used to keep track of all the edge rings that are received for use in the various fabrication systems (i.e., processing stations) within the fabrication facility. The encrypted code of the edge ring is also sent to the ER execution system. The ER execution system uses the edge ring information to create a metadata file for the edge ring. Movement of the edge ring within the fabrication facility is tracked by querying a FAB manufacturing execution system and the metadata file of the edge ring is updated to reflect the transfer of the edge ring into and out of the edge ring carrier and into and out of a processing station.

Figure 3:
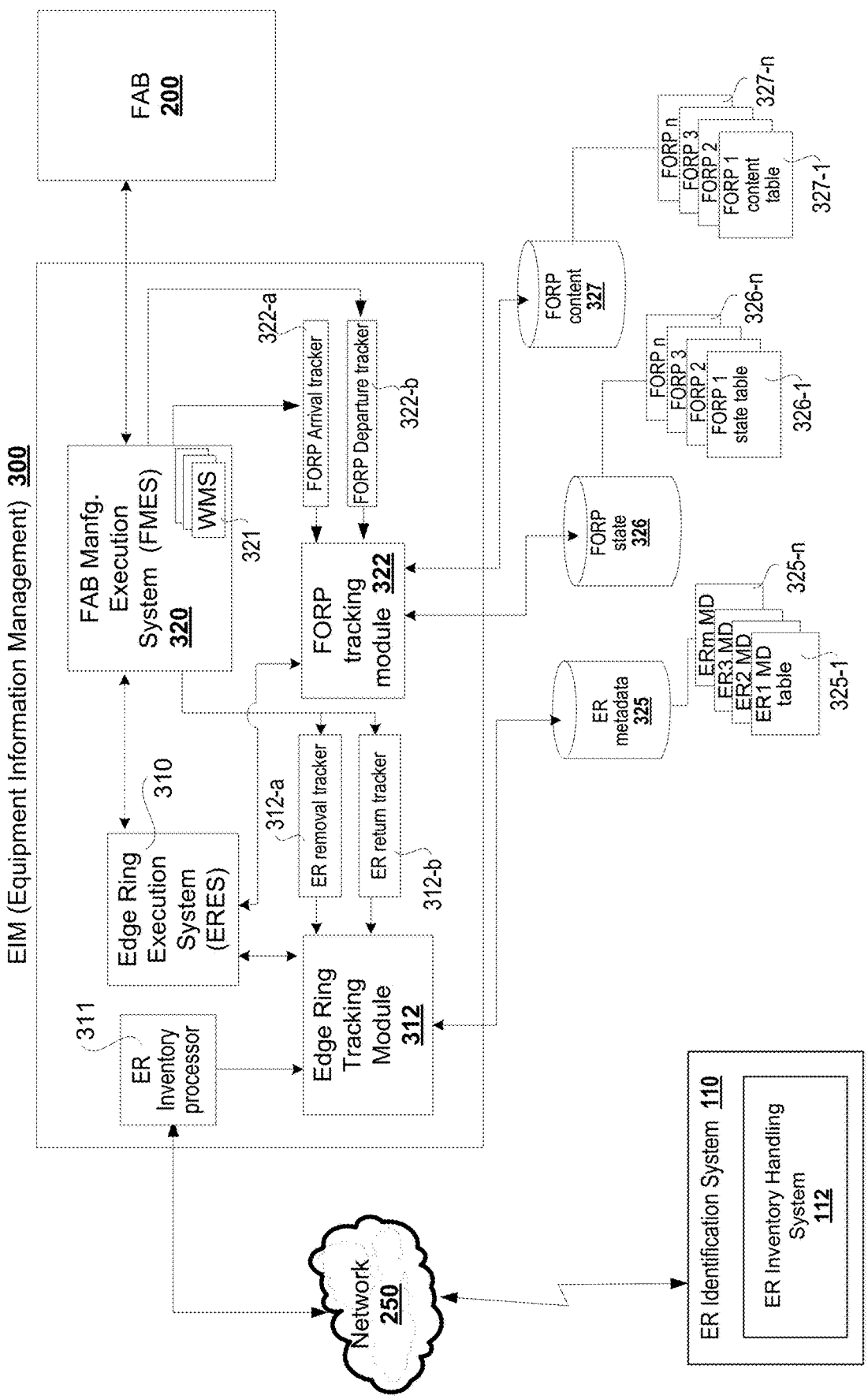
FIG. 3 illustrates an overall view of an edge ring execution system within a fabrication system uses edge ring identifier information to build metadata file for an edge ring, in one implementation.

FIG. 3 illustrates how the edge ring information captured by an ER identification system 110 is used to generate and update a metadata file for the edge ring and to update the information related to the edge ring carrier, in one implementation. Information related to an edge ring captured by the ER identification system 110 including, a carrier identifier of the edge ring carrier and a slot number within an edge ring carrier into which the edge ring is placed, is provided as an encrypted code to an ER inventory processor 311 executing on a server within the fabrication facility, over the network 250. The server may be a remote server accessed over a network, and in some instances, may be a cloud-based server that is communicatively connected to the ER identification system 110. The edge ring information is also used to update edge ring inventory maintained locally within the ER identification system 110.

The ER inventory processor module 311 may be part of an edge ring execution system (ERES) 310 or may be a separate module that provides information to the ERES 310. The ER inventory processor module 311 decrypts the encrypted code to extract information about the new edge ring. The decrypted information is provided to an edge ring tracking module 312 executing within the same server as the one on which the ER inventory processor module 311 is executing or may be executing on a different server. The edge ring (ER) tracking module 312 processes the information and provides the processed information to the ERES 310 to generate a metadata file for the new edge ring. Processing of the information of the new edge ring may include identifying a type associated with the new edge ring, a process for which the edge ring is designed, and determining a processing station and a process module within the fabrication facility that performs the process. The ER tracking module 312 interacts with the ERES 310 to exchange the edge ring related information. Using this information, the ERES 310 generates a metadata file for the new edge ring.

In some implementations, during processing, it may be determined that the ERES 310 does not have intended use information for the particular type of the new edge ring. This may be a case when a non-proprietary edge ring or an unknown edge ring or an unmarked edge ring is being introduced into the fabrication system. In such cases, the ERES 310 may generate a message, which is communicated to the ER identification system 110. The message may be provided to a user with a request to provide additional information related to intended use of the edge ring. In such a case, no metadata file is generated for the new edge ring.

In alternate implementation, when no intended use information is available for the new edge ring, the ERES 310 may proceed to generate a metadata file. The metadata file generated for the new edge ring may identify the new edge ring as an "unknown part". As more information is received from the ER identification system 110 for the type associated with the new edge ring, the intended use information is provided to the ERES 310 so that the metadata file for the new edge ring may be dynamically updated with the intended use information.

The metadata file generated for the new edge ring is stored in an ER metadata database 325. The ER metadata database 325 is a repository of metadata files generated for all edge rings that have entered the fabrication facility. Information provided in the metadata file is used to generate metadata tables (325-1 through 325-n) for each edge ring used in the different fabrication systems within the fabrication facility (i.e., fab) 200. The initial information included in the metadata file for the new edge ring is provided by the ER identification system and includes information, such as an edge ring identifier, an edge ring type, intended process, a carrier identifier of the edge ring carrier, an edge ring location (i.e., slot number of a slot) within the edge ring carrier, condition of the edge ring, a lifetime of use, etc., captured during loading of the new edge ring into an edge ring carrier. The condition of the edge ring may include new, used, or partially used, for example. It should be noted that the aforementioned fields captured for the new edge ring during loading of the new edge ring is given as an example and should not be considered restrictive.

As additional edge rings are introduced into the fabrication facility, information related to the additional edge rings is captured and the additional edge rings are loaded on to the edge ring carrier. When a new edge ring is received into the edge ring carrier, a lifetime of use of the edge ring is updated using information provided by an edge ring manufacturer. In some implementations, not all edge rings that are introduced into the fabrication facility are new. For example, an edge ring that was partially used in another fabrication facility may be introduced into the fabrication facility for use in a process module within the fabrication facility. The partially used edge ring may not have any metadata within the fabrication facility. As a result, when the partially used edge ring is received at the fabrication facility, the metadata is generated for the partially used edge ring in a manner similar to when a new edge ring is received. As the partially used edge ring already underwent some process in the different fabrication system, the lifetime of the partially used edge ring is less than that of a corresponding type of new edge ring. As a result, information for the partially used edge ring captured during loading will include any remaining lifetime of use for the partially used edge ring and the metadata file generated for the partially used edge ring will reflect such details.

In some implementations, the edge ring carrier may be configured to store and transport only new edge rings, or only used edge rings or a mixture of new and used edge rings. In some implementations where a mixture of new and used edge rings are being loaded to the edge ring carrier, the new edge rings may be received in a top portion and the used edge rings may be received in a bottom portion to prevent contamination of the new edge rings. In some implementations, the used edge ring portion defined within the edge ring carrier may be configured to also receive partially used edge rings. For example, in an edge ring carrier that has 12 slots, slot numbers 1-6 may be used to receive only new edge rings, and slot numbers 7-12 may be used to receive used and partially used edge rings. Partially used edge rings may be re-used in a process module, depending on type of process and amount of time required to run the process in the process module. The edge ring tracking module 312 continues to track the new, used and partially used edge rings in the fabrication system using the edge ring identifier and provide this information to the edge ring execution system (ERES) 310.

When an edge ring carrier 100 enters the fabrication facility and is moved in and out of a processing station, a FORP tracking module 322 is employed to keep track of the movement of the edge ring carrier and provide this information to the ERES 310. The FORP tracking module 322 is similar to a wafer management system (WMS) 321 that keeps track of the movement of the wafer carriers (e.g., FOUPs) within the fabrication facility. The wafer management system 321 obtains information related to a current location and current status of a FOUP from the AMHS by querying the FAB manufacturing execution system (FMES) 320 as the FOUP is moved to different locations within the fabrication facility 200. Similarly, the FORP tracking module 322 queries the FAB manufacturing execution system 320 to obtain information related to current location of the edge ring carrier.

A FORP arrival tracker 322-a within the FORP tracking module 322 interacts with the FMES 320 to obtain information of when the edge ring carrier arrived at a load port of a particular processing station. The FMES 320 provides this information using information obtained from the automated material handling system (AMHS). A FORP departure tracker 322-b within the FORP tracking module 322 interacts with the FMES 320 to obtain information related to when the edge ring carrier departed the load port of the particular processing station. The information on a current location and current status of the edge ring carrier is provided to the edge ring execution system (ERES) 310 to allow the ERES 310 to update the metadata file of each edge ring contained within the edge ring carrier. The metadata file of each edge ring builds lifetime information using initial information obtained from the ER identification system 110 and use information obtained from the fabrication system's manufacturing execution system 320.

The information related to the edge ring carrier gathered by the FORP tracking module 322 is also used to update a state of the edge ring carrier and store the state and other related information in a FORP state database 326. The FORP state database 326 is a repository for maintaining the states of various edge ring carriers used within the fabrication facility. The information stored in the FORP state database 326, such as a carrier identifier, a type, a current state of the edge ring carrier, a current location, intended process modules for the different edge rings contained within, intended processes for the edge ring, etc., are used to generate edge ring carrier state table 326-1 through 326-$n$ for each edge ring carrier (Forp001-00n, where n is an integer) used in the fabrication facility. An example state table of the different edge ring carriers is provided in Table D illustrated in FIG. 9.

As shown, the state table of the various edge ring carriers may include details that identify where the edge ring carrier is within the fabrication facility and a status of the edge ring carrier. For example, the state table may include a type of the edge ring carrier, (e.g., edge ring carriers that only carry used edge rings, edge ring carriers that only carry new edge rings, edge ring carriers that carry both the new and used edge rings, including partially used edge rings), a current location of each edge ring carrier (e.g., is it at a processing station or queued in the stocker), status of the edge ring carrier, intended process modules, type of process for which edge rings are being delivered using the edge ring carrier. The intended process modules and the type of process information may be provided based on the type of edge rings that are loaded on to the edge ring carrier. A sample set of status of the edge ring carriers are shown in above table D, such as enroute for delivery to a processing station, scheduled for delivery to a processing station, delivered and moving out of a processing station, queuing in stocker, enroute to a processing station for pickup, etc. Each of these statuses provides sufficient detail to determine the location of the edge ring carrier and from that location of the edge ring within the fabrication facility.

When an edge ring is moved in and out of the edge ring carrier, the edge ring tracking module 312 keeps track of the movement of the edge ring and provide this information to the ER execution system (ERES) 310. An ER removal tracker 312-$a$ of the edge ring tracking module 312 interacts with the FAB manufacturing execution system 320 to obtain current location of the edge ring carrier and a purpose (e.g., loading, delivering, exchanging of edge rings, leaving, etc.,) of the edge ring carrier at the location using information provided by the AMHS. For example, the FAB manufacturing execution system 320 may provide the current location of the edge ring carrier as a load port of a particular processing station and identify a purpose of the edge ring carrier at the time it is at the load port. In addition to the information provided by the FAB manufacturing execution system 320, one or more sensors distributed on and/or within the processing station may be used to obtain additional information as the edge ring moves inside the processing station. As described with reference to FIG. 2, the processing station may include a plurality of modules, such as load ports, atmospheric transfer module (ATM), an aligner within the ATM, a robot within the ATM, one or more loadlock chambers, a vacuum transfer module, a robot within the VTM, and one or more process modules.

Sensors provided in one or more modules within the processing station may be used to obtain additional information on the current location and current state of the edge ring within the processing station. The information gathered by the FAB manufacturing execution system 320 from the AMHS and the various sensors are forwarded by the edge ring tracking module 312 to the edge ring execution system (ERES) 310. The ERES 310 processes this information to determine current state, current location of each edge ring carrier and each edge ring, and updates the ER metadata table of each edge ring within the ER metadata database 325, and the current state of each edge ring carrier in the FORP state database 326. Additionally, changes to content of the edge ring carrier are updated to a FORP content database 327. The FORP content database 327 is a dynamic repository that maintains details of each edge ring carrier employed within the fabrication facility. The information provided in the FORP content database 327 are used to update the edge ring carrier content tables 327-1 through 327-$n$ for the corresponding edge ring carriers FORP ID 001-FORP ID 00n.

When the edge ring carrier is moved to a load port of a processing station and a new edge ring is moved out of the edge ring carrier and into a process module within a processing station, the metadata file of the new edge ring is updated to identify the current location of the edge ring in the process module. The current location may be identified using the processing station identifier and a process module identifier within the processing station. An insertion time identifying when the new edge ring was introduced into the process module, is also recorded in the metadata file of the new edge ring. When a process is performed within the process module after inserting the new edge ring, the metadata file of the new edge ring is updated to identify a type of process performed within the process module, and a use time to identify when the process started and ended. The insertion time may not coincide with the use time as the edge ring may be inserted into the process module before a wafer is introduced for undergoing a process. The use time is used by the ERES 310 to determine remaining lifetime of the edge ring. Additionally, a current status of the new edge ring is updated from "new" to "used", in response to detecting the use of the new edge ring within the process module. When the edge ring is moved from the current process module to a second process module within the same processing station, sensors provided within the processing station provide the details of when the edge ring was moved out of the current process module and inserted into the second process module. When a process is performed within the second process module, the use time of the edge ring is updated with the information from the second process. After completing the process(es) in the second process module, the edge ring may be moved to a second edge ring carrier that has arrived at the load port of the processing station. The second edge ring carrier may transport the edge ring to a different processing station or move it out of the fabrication facility for discarding, when the lifetime use of the edge ring has been completely or mostly spent.

An ER return tracker module 312-$b$ in the edge ring tracking module 312 keeps track of when an edge ring is returned to a second edge ring carrier and records the time of removal of the edge ring from a process module. As mentioned previously, an edge ring carrier may be configured to hold only new edge rings, only used edge rings or a mixture new and used edge rings. When an edge ring is to be replaced within a process module, the used edge ring is removed from the process module and returned to an edge ring carrier that can hold the used edge ring. A new edge ring (or a partially used edge ring) is retrieved from an edge ring carrier that holds the new edge ring (or the partially used edge ring) and inserted into the process module. The removal of the used edge ring and the insertion of the new edge ring are accomplished using robots within the processing station (e.g., ATM, VTM robots and, in some cases, robot within the edge ring carrier) and such replacement is done without breaking vacuum. The edge ring carrier to which the used edge ring is returned could be the same as the edge ring carrier from which a new edge ring is retrieved or it could be a different edge ring carrier. The ER removal tracker 312-a and the ER return tracker 312-b provide details of the edge rings that were removed from or returned to the different edge ring carriers and this information is provided to the edge ring execution system 310.

The edge ring execution system 310 uses the various data collected from different modules (e.g., edge ring tracking module, FORP tracking module) to determine a current content of each edge ring carrier and current state/condition of each edge ring within each edge ring carrier, including lifetime used, lifetime remaining for an edge ring, process history of the edge ring, etc. The information related to edge rings stored in each edge ring carrier is dynamically updated to the corresponding FORP content table 327 maintained for each edge ring carrier type as and when changes are detected to the content of the edge ring carrier. An example table A of content of a particular edge ring carrier is illustrated in FIG. 10.

The information provided in the Table A illustrated in FIG. 10 above for an edge ring carrier FORP001 may include a type of edge ring carrier (edge ring carrier that carries only used edge rings, edge ring carrier that carries only new edge rings, or edge ring carriers that carry a mixture of new and used edge rings, slots locations for carrying a new edge ring or used edge ring, etc.). This information can be used to determine which open slot can be used to insert a new edge ring received into the fabrication facility, which open slot to insert a partially used or a fully used edge ring, lifetime remaining for each edge ring, etc.

Information provided in the various tables (ER metadata table, FORP state table, FORP content table) provide pertinent details that use data obtained from the ER identification system and data obtained from the FAB's manufacturing execution system (MES) to determine when a particular edge ring is to be replaced within a process module, when a used edge ring needs to be discarded, which edge ring carrier to use to load new edge rings, which edge ring carrier to use to load used edge rings, whether a type of edge ring used in a process module within a particular processing station is included within an edge ring carrier that is scheduled for delivery to the particular processing station, whether an edge ring intended for a particular process module has sufficient lifetime left to undergo one or more processes within the particular process module, etc. Additional information, such as what types of processes are being conducted in each process module, what type of chemistries are being used, where in the fabrication system a problem was detected, what time a problem occurred, where the edge ring and the edge ring carrier was when the problem was detected, condition of the edge ring when the problem was detected, where the wafer was when the problem was detected, condition of the wafer, etc., can be obtained from querying the FAB's MES and used in providing more in-depth survey of the condition of the various process modules within the fabrication facilities.

In some implementations, once introduced into a process module within a processing station, the edge ring may remain in the same process module till its lifetime of use expires or is close to expiring. In alternate implementations, the edge ring may follow a wafer as the wafer moves to different process modules within the same processing station or different processing stations. The ER removal tracker 312-a tracks the edge ring to determine when an edge ring is removed from a process module within a processing station. The ER removal tracker 312-a obtains information related to the current location and type of processes the edge ring has been exposed to determine a condition of the edge ring within the processing station. The various information updated to the metadata table for the edge ring, provides rich usage history of the edge ring. For example, an edge ring may have a lifetime of use of 200 hours and the information provided in the edge ring metadata table may be used to keep track of the usage history of the edge ring to determine where the edge ring is currently located and when the edge ring needs to be replaced. A sample metadata table for an edge ring A-1 that was introduced and used in the fabrication system is provided in Table B illustrated in FIG. 11.

As shown in Table B, the edge ring A-1 may have undergone different processes in different process modules. The table shows the edge ring use time (in hours), the type of process that the edge ring A-1 was used in, the processing station and the process module within the processing station where the edge ring A-1 was used. For example, the edge ring A-1 was loaded onto edge ring carrier, FORP001, and delivered to processing station S-087 for inserting into process module PM-01X1 to undergo an etch 1 operation. After the etch 1 operation, the edge ring A-1 may have been moved to process module PM-01X3 within the same processing station S-087 where another etch (etch 2) operation is performed. The etch ring A-1 may have been removed from the process module PM-01X3 using ATM/VTM robots and loaded onto a second edge ring carrier, FORP002, and moved to a second processing station S-172 for inserting into a different process module PM-07Y3 where additional etch (etch 3) operation may have been performed. After etch 3 operation, the edge ring A-1 may have been moved to process module PM-27X5 within the same processing station S-172 where another etch (etch 4) operation may have been performed. Depending on the type of process (e.g., etch) that is performed in each process module, the etch time may be different from one another or same in each processing station or same in each and every process module.

For simplicity sake, the process to which the edge ring is exposed in various process modules is shown in Table B as an Etch operation. It should be noted that the etch operation is not restricted to any one particular type of etching but could include various types of etching, including metal etching, dielectric etching, etc. This can be evidenced by the varying amount of time taken in each process module for etch operations, indicating different types of etching being performed in different process modules. The details captured in the metadata of the edge ring are not restricted to the fields that are provided in Table B but could include additional fields that may be useful in determining the usage history of the edge ring.

The ERES 310 maintains information of all the edge rings and edge ring carriers used in the fabrication facility in corresponding files/databases. The ERES 310 uses information provided in the various files/databases (e.g., metadata file/database of edge ring, FORP state file/database and FORP content file/database for each edge ring carrier) to provide additional details, such as routing history of each edge ring within the fabrication facility, etc. The routing history provides details of movement of the edge ring within the fabrication/database. In some implementation, information provided in the routing history of an edge ring may be accessed from a link provided in the edge ring field of the metadata table of the edge ring shown in Table B (the edge ring field is shown in highlighted box). An example routing history of edge ring, A-1, accessed from a link provided in the edge ring field of Table B shown in FIG. 11, is provided in Table C illustrated in FIG. 12.

The details of the edge ring moved into and out of the edge ring carrier and into and out of processing stations captured by the AMHS and the sensors are used in providing the routing history. Information provided in the routing history may be used to keep track of the lifetime of use of the edge ring. As the edge ring nears its end of life, a signal may be generated by the edge ring execution system to indicate that the edge ring in a particular process module is nearing its end of use life and needs to be replaced.

The FAB manufacturing execution system 320 and edge ring execution system (ERES) 310 may be executed by two different servers within the fabrication facility but communicatively connected over a network to exchange information related to the edge ring and the edge ring carrier within the fabrication facility. The edge ring execution system 310 tracks the edge ring and the edge ring carrier and dynamically queries the FAB manufacturing execution system 320 to obtain additional information related to the overall condition of the various parts within the fabrication facility and uses the obtained information to provide details of the status of the edge ring, the status of edge ring carrier and overall status of different parts and modules within the fabrication facility so that informed routing and/or processing decisions can be made so that optimal use of the edge ring can be realized.

The FAB manufacturing execution system 320 and the edge ring execution system 310 may be part of an overall equipment information management (EIM) system 300 that is executing on a computing device within the fabrication facility or is a part of a cloud server. The EIM system may be a stand-alone system within a fabrication facility or may be part of a network of systems that exchange information with other fabrication facilities and part manufacturers. Information from the different systems may be queried to extract details related to the overall condition and state of the edge ring, the wafer, and the process modules. The automated tracking of the edge ring and detailed analysis of the information obtained from the tracking ensures that correct type of edge rings are loaded onto the FORPS and provided to process modules within the different fabrication systems (i.e., processing stations). This eliminates any loading errors, unnecessary wafer scraps resulting from loading errors, prevents used edge rings from being accidentally provided to process modules, thereby improving lifetime use of the edge ring and increased wafer processing yield. The information obtained from the tracking can be used to accurately determine edge ring lifetime for building statistical and cost of ownership models. In some implementations, queries to the FAB MES may require filtering out any proprietary information prior to providing query results to the edge ring execution system 310. For example, some processes performed in certain ones of the process modules may include proprietary processes that are not to be shared. In order to avoid returning such proprietary information from the FAB MES for the queries, an obfuscation filtering may be employed either at the FAB MES or at the edge ring execution system so that only information that can be shared is included in the tables while the proprietary information is left out.

The various tables that are generated from the information obtained from tracking the edge ring through the fabrication system may be in the form of relational database tables. These relational database tables can be queried or searched in real-time to access the information related to the edge ring and the edge ring carrier. Further, these relational databases may be queried and results from the queries may be combined with information obtained from other sources within or outside the fabrication facility to generate additional tables that can be linked to the existing tables in order to provide additional information that can enhance the information provided in the existing tables. For example, the other tables may provide information from other fabrication facilities or manufacturing execution systems or manufacturers and such information can enhance the information that is captured in the edge ring execution system to provide more details of the edge ring and the processes where these edge rings can be used. It should be noted that storing the various details related to the edge ring execution system in relational database tables is one way and that other ways or forms of storing the information can also be envisioned.

The various implementations use an edge ring identifier and other relevant information of an edge ring to track the edge ring within the fabrication facility. Thus, when the edge ring is to be delivered to a processing station, the edge ring identifier and the relevant information related to the edge ring are used to verify that the part number read from the edge ring identifier is correct for installation into a process module within the processing station. If the part number is incorrect, controls within the edge ring execution system are used to post an alarm and prevent transferring the edge ring to the process module. The various implementations enable automatic identification and verification of the edge ring design prior to being inserted for use in a process module, thereby avoiding unnecessary scraps.

It should be noted that although the various implementations have been described with reference to tracking edge rings, the implementations are not restricted to tracking edge rings but can be extended to tracking other consumable parts used within the fabrication facility.

Figure 4:
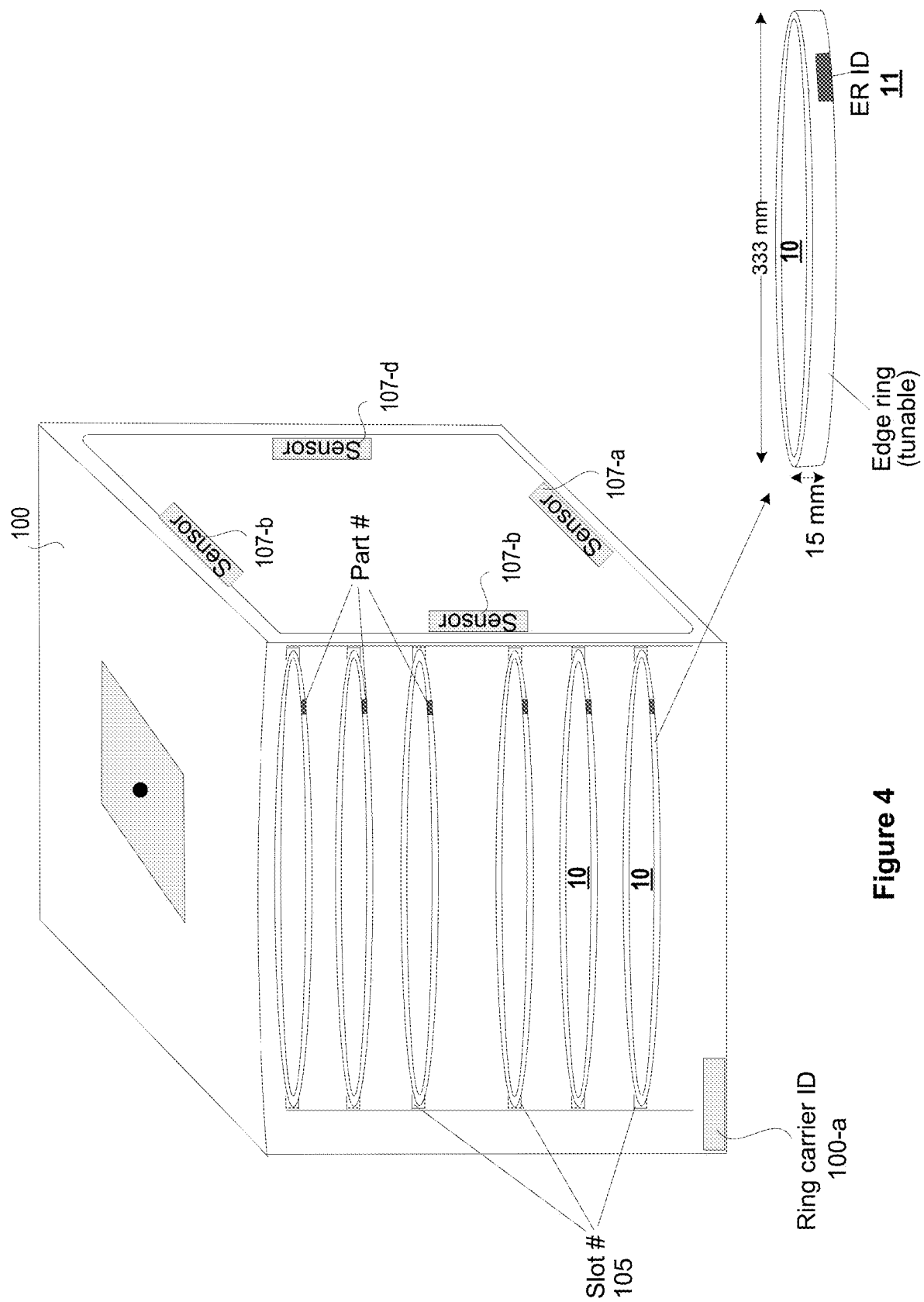
FIG. 4 illustrates a simplified view of an edge ring carrier with a plurality of slots for storing the edge ring and sensors for tracking location of the different edge rings contained within, in one implementation.

FIG. 4 illustrates a simplified view of an edge ring carrier 100 that is used to track edge rings at the initial loading stage as well as during the removing/replacing stage, in one implementation. The edge ring carrier is identified using a carrier identifier 100-*a*. The carrier identifier may be provided as a tag or provided on a plate, etc. A plurality of slots is defined within to receive the edge rings 10. Each of the slots is identified using a slot number 105. A plurality of sensors (107-*a* through 107-*d*) may be provided within the edge ring carrier 100 to track the edge ring as it is being moved into and out of the edge ring carrier. The information provided by these sensors may be used to verify the information captured during automatic loading or provided by a user, when the edge ring is manually loaded, and by the AMHS in the fabrication system as the edge ring is being used. The information is used to update the metadata of the edge ring and the information related to the edge ring carrier maintained within the FORP state database and FORP content database. The edge ring loaded onto edge ring carrier may be a replaceable edge ring or a tunable edge ring. An example tunable edge ring is shown in FIG. 4. In the case of a tunable edge ring, the edge ring may be of a particular height. The height is used in prolonging the life of the edge ring before it has to be replaced. For example, as the surface of the edge ring, exposed to the harsh chemicals within the process module, gets damaged, the edge ring received on a pedestal of a process module, may be moved up using lift pins to allow newer surface of the edge ring to be exposed to the harsh chemicals within the process module. When the height of the edge ring reduces to a pre-defined height, the edge ring may have to be replaced. The various implementations described herein can be extended to a tunable edge ring as well as a replaceable edge ring (i.e., an edge ring that does not have sufficient height).

FIGS. 5A-5D illustrate various modules within the processing station on which sensors may be disposed to track the movement of the edge ring. As the AMHS has access only to the load ports located outside a processing station, the AMHS is able to provide location and status information leading up to the load ports of the processing station. Information of the actual use of the edge ring within the processing station is important to determine usage history of the edge ring at the actual site of use (i.e., process module). The sensors located in different modules of the processing station assist in tracking the edge ring use within the processing module.

Figure 5A:
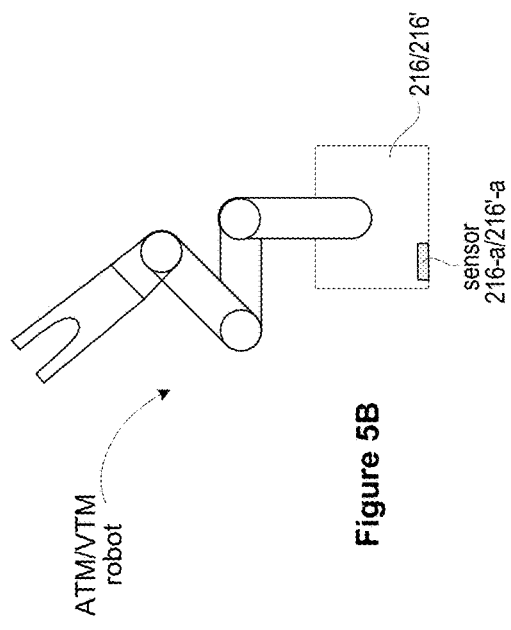
FIGS. 5A-5D illustrate sensors distributed throughout a processing station to keep track of a location and condition of the edge ring, in accordance with one embodiment.

FIG. 5A illustrates a simplified overhead view of a loadlock chamber 213 that is located between an atmospheric transfer module (ATM) and a vacuum transfer module (VTM) within the processing station. The loadlock chamber 213 includes an opening to the ATM and an opening to the VTM. One or more sensors (213-$s1$, 213-$s2$) may be provided on an inside side wall proximate to an opening to the ATM and one or more sensors (213-$s3$, 213-$s4$) may also be provided on an inside side wall proximate to an opening to the VTM. These sensors enable tracking the edge ring as it moves into the loadlock chamber and as it exits the loadlock chamber 213.

Figure 5B:
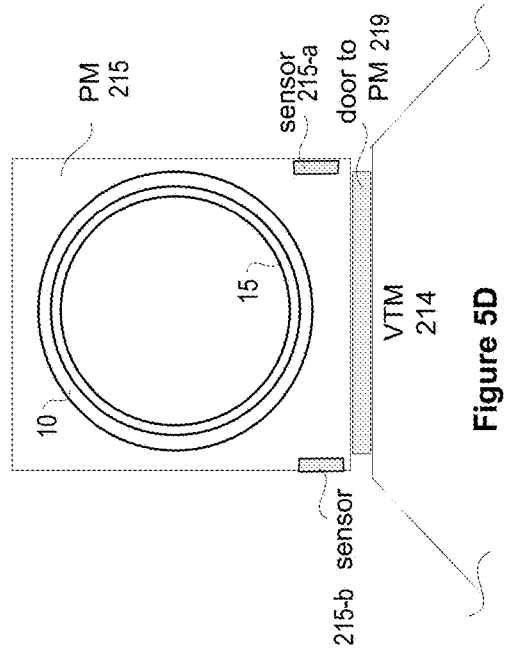

FIG. 5B illustrates a robot that can be used to move the edge ring within the processing station. The robot (216 (ATM)/216' (VTM)) may be part of the ATM or the VTM. The robot may include one or more sensors 216-$a$/216'-$a$ that keeps track of the edge ring as it is being moved between a process module and a load port for loading onto the edge ring carrier received at the load port. The VTM robot may be configured to move the edge ring between the process modules and between a process module and a loadlock chamber, and the ATM robot may be configured to move the edge ring from the loadlock chamber into a particular slot within the edge ring carrier. Information captured by the sensor of the robot and the one or more sensors within the ATM and/or the edge ring carrier can be used to verify the location of the edge ring within the edge ring carrier.

Figure 5C:
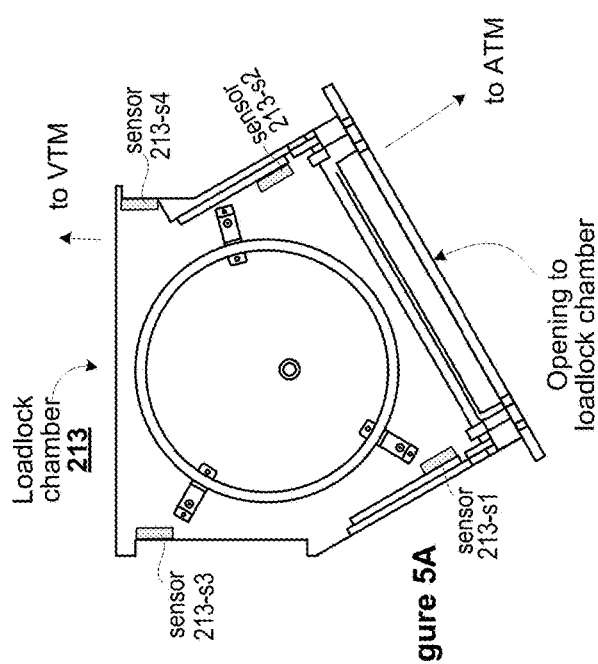

FIG. 5C illustrates an aligner 217 within an ATM 212 that may be used to align the edge ring prior to delivering to a process module within a processing station. The aligner 217 includes a spinner 218 that moves the edge ring 10 along an axis of rotation (e.g., horizontal axis). The aligner 217 may be used to position the edge ring 10 so that the edge ring identifier may be easily read by the one or more sensors (217-$a$, 217-$b$) on the aligner and by one or more sensors distributed in other modules of the processing station. If the edge ring identifier is on an outer side of the edge ring, the sensor may be able to easily read the edge ring identifier. The sensor 217-$a$ may be strategically located based on the location of the edge ring identifier on the edge ring.

Figure 5D:
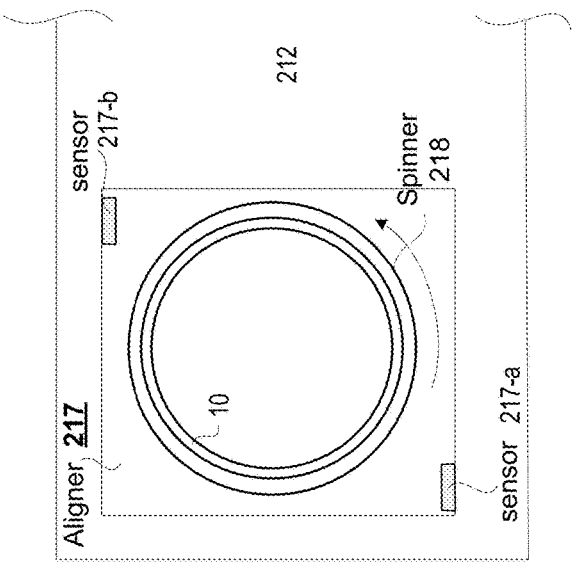

FIG. 5D illustrates a process module 215 in which sensors 215-$a$, 215-$b$ may be located proximate to an opening or a door 219 to the process module 215. The edge ring 10 is placed adjacent to a wafer 15 received within the process module 215 so as to extend the surface of the wafer 15. When the edge ring needs to be replaced, the edge ring is lifted up using lift pin mechanism available at the wafer receiving surface, and out of the process module 215 using the robot of the VTM. As the edge ring moves through the door 219, the sensors 215-$a$, 215-$b$ may be able to capture the edge ring identifier. The location of the sensors 215-$a$, 215-$b$ may be on the inside sidewalls of the process module, on the bottom surface facing up, on the top surface facing down, or anywhere in-between.

The number of sensors provided in the various modules is just an example and fewer or greater number of sensors may be provided in the various modules to capture the edge ring identifier of the edge ring as the edge ring is being transported into and out of the various modules.

Figure 6:
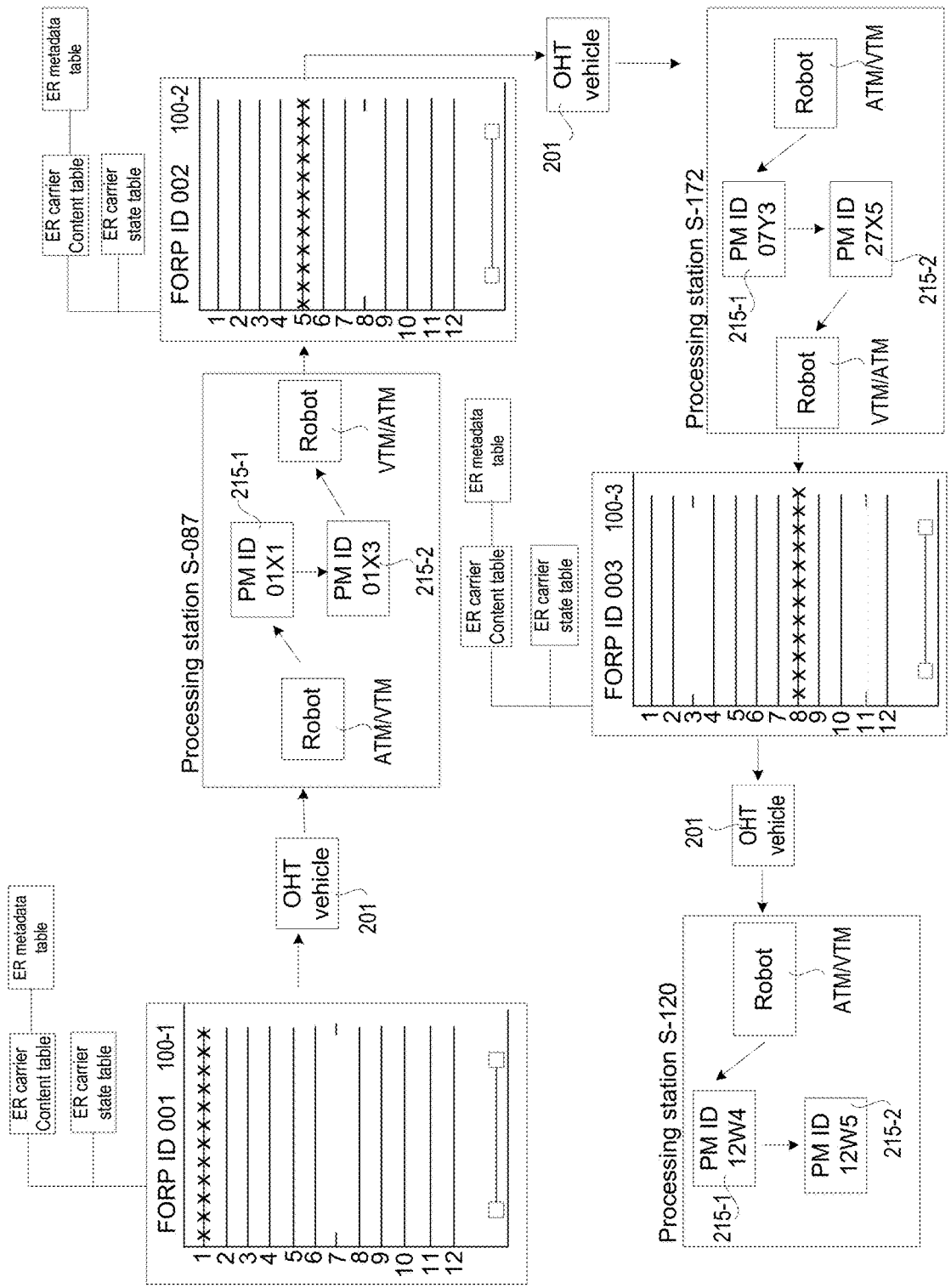
FIG. 6 illustrates movement of the edge ring to different process modules within a fabrication system, in one implementation.

FIG. 6 illustrates an example tracking of an edge ring as it is being transported into and out of edge ring carriers and into and out of processing stations within a fabrication facility, in one implementation. The various tables that include information obtained from the tracking are provided to reflect this tracking.

The initial process begins when an edge ring, A-1, is loaded onto edge ring carrier (FORP ID 001) 100-1 in slot number 1. The edge ring carrier 100-1 includes a plurality of edge rings located in slots numbers 2-6 and 8-12, with slot number 7 open. The loading information is updated to an edge ring carrier content table to reflect the addition of edge ring A-1 into FORP ID 001, and the edge ring information of the edge ring A-1 is updated to the metadata table for the edge ring A-1. An overhead transport (OHT) vehicle 201 moves the edge ring carrier to a processing station 210 (Station identifier S-087). The OHT vehicle 201 may be part of the AMHS material handling system that is used to move the edge ring carriers and wafer carriers (i.e., FOUPs) to different processing stations. As the edge ring carrier arrives at the processing station S-087, the edge ring carrier information relating to a location in the fabrication facility, is updated to the edge ring state table for FORP ID 001. The edge ring A-1 is then moved out of slot 1 of the edge ring carrier FORP ID 001 and into the process module 215 (process module identifier 01X1) in the processing station S-087 using atmospheric transfer module (ATM) and vacuum transfer module (VTM) robots. The edge ring A-1 is moved into the process module upon verification that the edge ring A-1 that is intended for the process module 01X1 is the correct edge ring and that edge ring A-1 has sufficient lifetime use left to be inserted into the process module 01X1 for an etch operation. If the edge ring A-1 has insufficient lifetime use left, then a warning signal is generated and the edge ring A-1 is not moved out of the edge ring carrier FORP001. Upon successful verification that edge ring A-1 has sufficient lifetime use, Carrier content information for FORP ID 001 is updated to show the removal of the edge ring A-1.

An etch operation (etch 1) is performed in the process module 01X1 (215-1). After conclusion of etch 1 operation, the edge ring A-1 is moved using the VTM robot to a second process module 01X3 within the same processing station S-087. The edge ring metadata is updated to show the current location and current condition of the edge ring, after etch 1 operation within the processing station S-087. A second etch operation (etch 2) is performed in process module 01X3 and upon conclusion of etch 2 operation, the edge ring A-1 is moved out of the processing station S-087 to a second edge ring carrier, FORP ID 002 using the VTM/ATM robots of the processing station S-087. The edge ring A-1 is loaded onto open slot 5 of edge ring carrier, FORP ID 002, leaving only slot 8 in the edge ring carrier open. In this case, FORP ID 002 is a mixed rings edge ring carrier and the new and used edge rings are placed randomly into open slots. The edge ring carrier content table and the edge ring state table for FORP ID 002 are updated, and the current location (in slot 5 in FORP ID 002) and current condition of the edge ring (after etch 2 operation) is updated to the metadata table for the edge ring A-1.

The OHT vehicle 201 of the AMHS is used to move the edge ring carrier to a second processing station S-172. As the edge ring carrier arrives at the processing station S-172, the edge ring carrier information is updated to the FORP state table for FORP ID 002.

The edge ring A-1 is then moved out of the edge ring carrier FORP ID 002 and into the process module 07Y3 in the processing station S-172 using ATM/VTM robots of processing station S-172. The movement of the edge ring A-1 into the process module 07Y3 is done upon verification that the edge ring A-1 that is intended for the process module 07Y3 is the correct edge ring and that edge ring A-1 has sufficient lifetime use left to be inserted into the process module 07Y3 for an etch operation. The FORP content table for FORP ID 002 is updated to show removal of the edge ring from slot 5 and insertion into the process module 07Y3 in processing station S-172.

An etch operation (etch 3) is performed in the process module 07Y3. After conclusion of etch 3 operation, the edge ring information is updated to the metadata table for the edge ring A-1. The edge ring A-1 is then moved out of the process module 07Y3, using the VTM robot, to a second process module 27X5 within the same processing station S-172. An etch operation (etch 4) is performed in process module 27X5. Upon conclusion of etch 4 operation, the edge ring A-1 is moved out of the processing station S-172 to a third edge ring carrier, FORP ID 003 using the ATM/VTM robot of the processing station S-172. The edge ring is loaded onto open slot 8 of the third edge ring carrier, FORP ID 003 leaving slots 3 and 11 open in the edge ring carrier FORP ID 003. In response, the metadata table of the edge ring A-1, and the state table and content table of the edge ring carrier FORP ID 003 is updated with the current location and condition of the edge ring.

The OHT vehicle 201 of the AMHS moves the edge ring carrier FORP ID 003 to a third processing station S-120. As the edge ring carrier FORP ID 003 arrives at the processing station S-120, the edge ring carrier information is updated to the FORP state table for FORP ID 003.

The edge ring A-1 is moved into the process module 12W4 for an etch operation (etch 5) after verifying that the edge ring A-1 has sufficient lifetime use left for an etch operation that is scheduled in the process module 12W4 and that the edge ring is suitable for inserting into the process module 12W4. The edge ring carrier information is updated to the FORP content table for FORP ID 003 to indicate removal of the edge ring A-1 from slot 8 and into the processing station S-120. After conclusion of etch 5 operation, the edge ring information is updated to the metadata table for the edge ring A-1. The edge ring A-1 is then moved out of the process module 12W4, using the VTM robot, to a second process module 12W5 within the same processing station S-120. An etch operation (etch 6) is performed in process module 12W5. Upon conclusion of etch 4 operation, the edge ring metadata file is updated to show the current condition of the edge ring. The various tables related to the edge ring and the edge ring carrier are kept dynamically updated as and when changes to the state, location of the edge ring or the state, location of the edge ring carrier is detected by the ERES so as to provide current state, location of the edge ring and the edge ring carrier within the processing station.

The tables illustrated in FIGS. 13-17 show the various entries that were updated during different stages of tracking of the edge ring as the edge ring was moved into and out of the edge ring carrier and into and out of various process modules within different processing stations. Table A illustrated in FIGS. 13-15 shows the content details in each FORP that is in use within the fabrication system, Table B illustrated in FIG. 16 shows the metadata of various edge rings that are loaded onto the different FORPs, Table C illustrated in FIG. 12 shows the edge ring routing history of each edge ring, and Table D illustrated in FIG. 17 shows the FORP state table for all the FORPs that are used in the fabrication system. For example, Table A illustrated in FIG. 13 for FORP ID 001 (or simply FORP 001) shows the condition of the edge ring carrier FORP ID 001 when the edge ring A-1 was initially loaded into open slot 1. The content shown in Table A for FORP 001 is the same as the Table A shown in an earlier example illustrated in FIG. 10, except a link is provided to Table B. Table A illustrated in FIG. 14 for FORP 002 shows the details of content of the edge ring carrier when edge ring A-1 was inserted into open slot 5 and Table A illustrated in FIG. 15 for FORP 003 shows the details of content of the edge ring carrier when edge ring A-1 was inserted into open slot 8. As the edge ring moves through the fabrication facility via the various edge ring carriers, the lifetime of the edge ring is dynamically adjusted to reflect the current lifetime usage, as determined from the different processes the edge ring was exposed in the different process modules. Similarly, the metadata shown in Table B of FIG. 16 shows the various processes the edge ring A-1 was subjected to in the different process modules in different processing stations. The metadata shown in Table B of FIG. 16 can be accessed through a link in provided in Table A of FIGS. 13-15. Details presented in Table B of FIG. 16 for edge ring A-1 is the same as the Table B shown in an earlier example illustrated in FIG. 11 except for the link to access Table C. Table C illustrated in FIG. 11 shows the edge ring routing history for edge ring A-1 as it moves into and out of the edge ring carrier and into and out of the process modules within the different processing stations. Contents of Tables A, B and C illustrated in FIGS. 13-16 and 11 provide an overview of the changes in the different FORPs and edge ring data as the edge ring travels through the various modules within the fabrication facility. The routing history content of edge ring shown in Table C of FIG. 11 can be accessed using a link provided at the edge ring A-1 field in Table B. Table D of FIG. 17 shows the various edge ring carriers state during the tracking of the edge ring within the fabrication system.

The above tables reflect the state of the edge ring and the various edge ring carriers progressing through the fabrication facility, to match with the example illustrated in FIG. 6.

Figure 7:
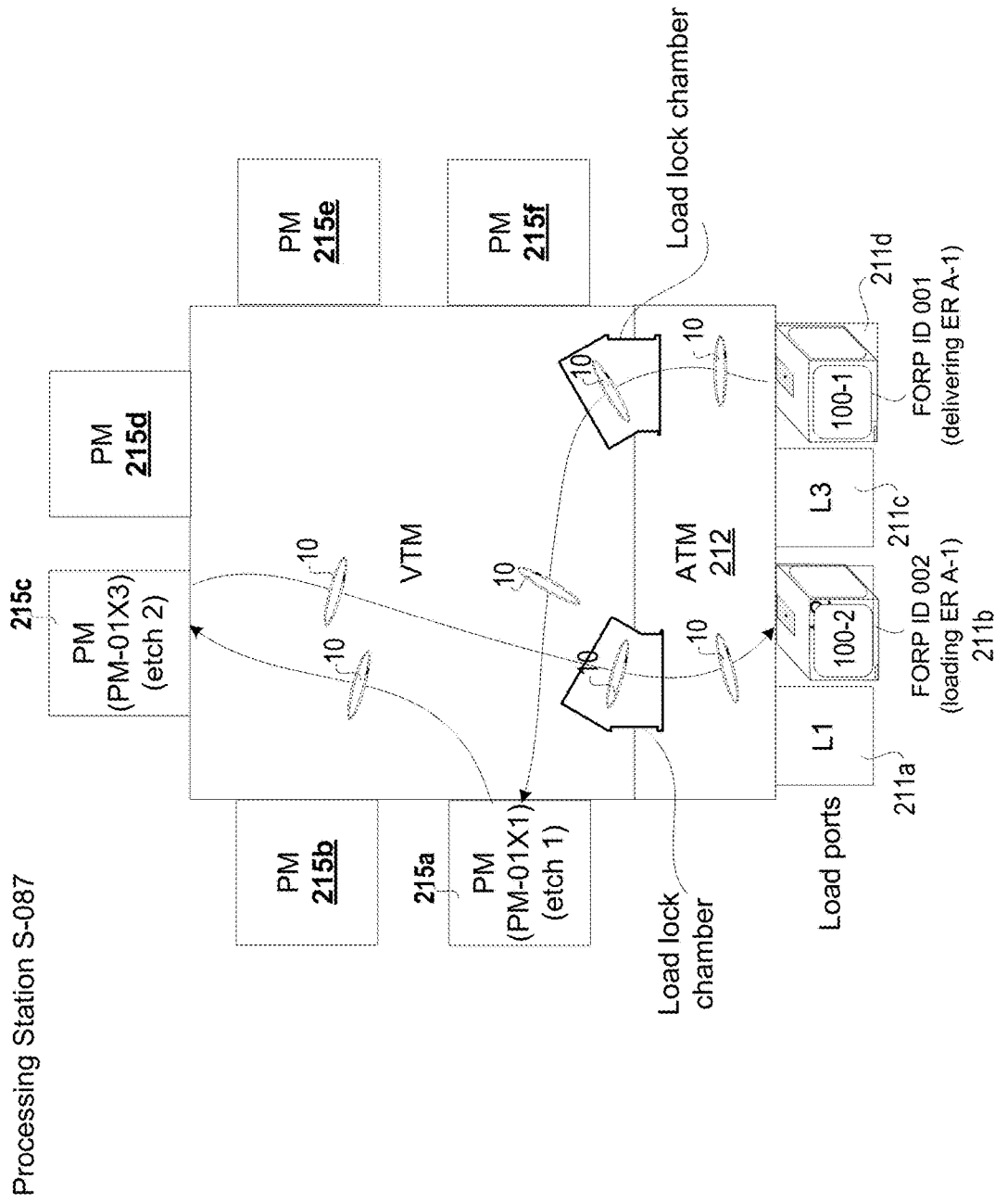
FIG. 7 illustrates progression of an edge ring within a processing station, in one implementation.

FIG. 7 illustrates a graphical representation of the movement of the edge ring within the processing station as captured by the various sensors distributed within the processing station, in one implementation. As discussed with reference to FIGS. 4 and 5A-5D, sensors are provided within the edge ring carrier and in different modules of the processing station to capture the path the edge ring takes within the processing station so that a current condition and location of the edge ring can be determined and used in providing a current state of the edge ring. For example, the sensors in the edge ring carrier can be used to determine when the edge ring is moved out of the edge ring carrier for delivery to a process module within a processing station. As the edge ring moves through the ATM of the processing station, sensors provided in the ATM, the ATM robot, and the aligner may be used to track the edge ring progressing through the ATM. The sensors provided in the loadlock chamber may be used to determine when the edge ring was being moved into a process module from an edge ring carrier and when the edge ring was being moved out of the process module to the edge ring carrier. Sensors on the VTM robot may be used to determine which process module the edge ring is being moved to, what type of operation is being conducted in the process module, when the process started and when the process ended. The process start time and end time may be determined by identifying when the wafer was introduced into the process module and when the door to the process module was closed/opened. Sensors in the process module may be used to verify the time when the edge ring was introduced into/removed from the process module, when the wafer was introduced into/removed from the process module, and when the door to the process module was shut or opened. This information is used to determine when the process began in the process module, when the process ended in the process module, and when the edge ring was removed from the process module. The information from the sensors provide sufficient details required to determine the processes the edge ring was exposed to and the amount of time the edge ring was actually used within each process module. Using such information, lifetime usage and the lifetime remaining can be computed and used to provide valuable information that can be used to streamline the processes within the fabrication system. The information related to the use of the edge ring within the process module is obtained from the FAB facility and this information is linked with the initial load information from the ER identification system to provide comprehensive details of the use of the edge ring within the fabrication system.

Figure 8:
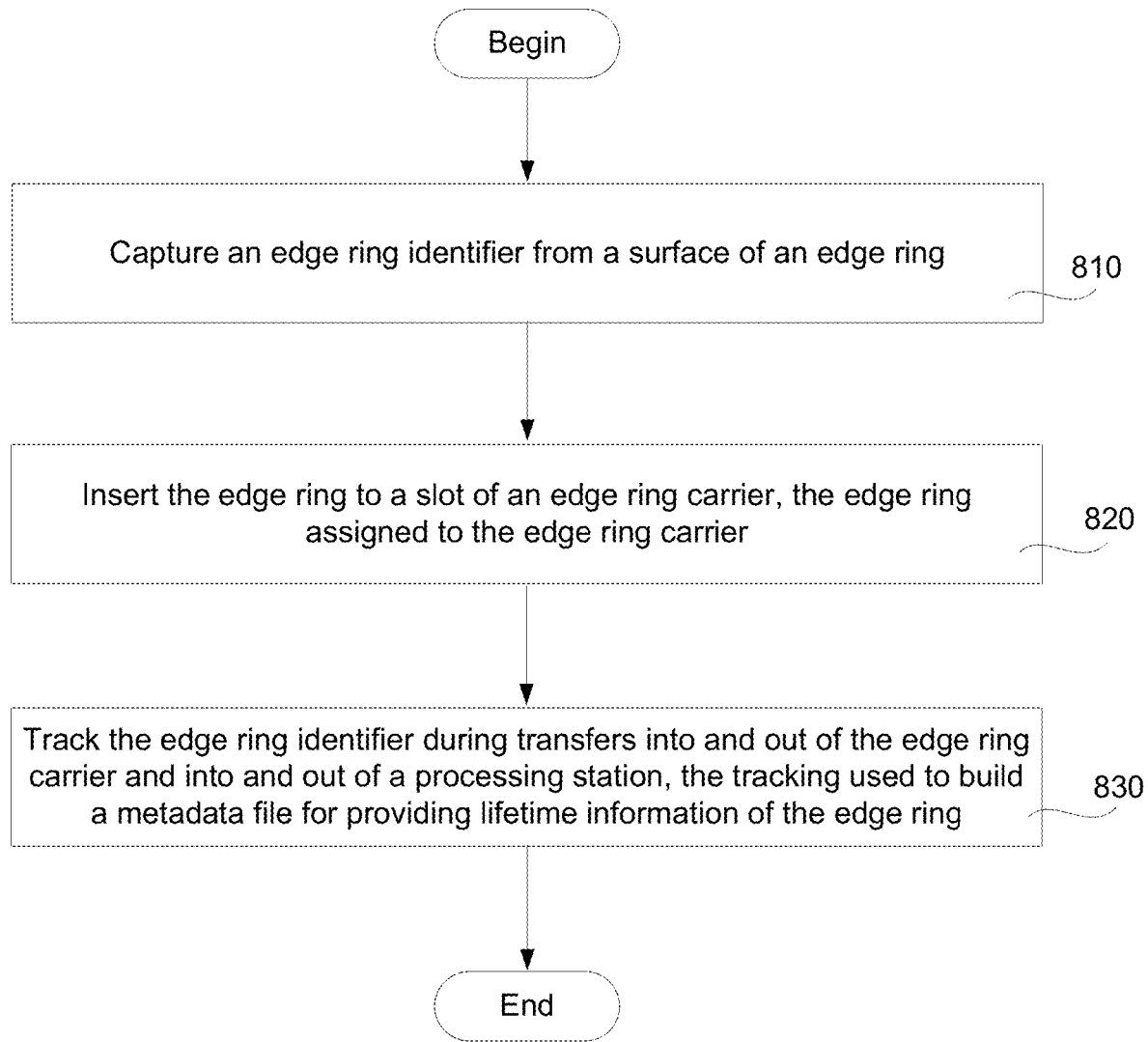
FIG. 8 shows flow of operations of a method used for tracking edge ring through a fabrication system, in accordance with one embodiment.

FIG. 8 illustrates process operations of a method used for tracking an edge ring, in one implementation. The method begins at operation 810, wherein an edge ring identifier of an edge ring is captured from a source related to the edge ring. The edge ring identifier may be provided on an outer side of the edge ring or on an underside surface of the edge ring or embedded within the edge ring or on a package of the edge ring, and may be in the form of alpha-numeric characters, an RFID tag, a barcode, a QR code, a dimple, a notch, a label, etc. An edge ring identifier capturing device, such as a reader, an image capturing device, or a sensor is used to automatically capture the edge ring identifier as soon as an edge ring is detected within an edge ring identification system. In some implementations where an image of the edge ring identifier is captured by the sensor, an optical character recognition (OCR) software may be used to convert the optical characters to textual data. In some implementations where an image capturing device is used, the image capturing device may capture the whole edge ring without spinning it. In some implementations, the edge ring may be manually scanned using a sensor and the information may be uploaded to a computer on a cart on which an edge ring carrier is received. The captured edge ring identifier is validated to ensure that the correct edge ring used in one or more process modules of one or more processing stations within the fabrication facility, is received.

The edge ring is then inserted into an open slot of the edge ring carrier, as illustrated in operation 820. The insertion may be manual or automated and is performed after successful validation of the edge ring. When the insertion is manual, the slot details may be entered into the computer by a user. One or more sensors provided in the edge ring carrier may be used to validate the information provided by the user. In the case where the insertion is automated, a robot or other material handling mechanism may be used to insert the edge ring into the open slot of the edge ring carrier. Information from the material handling mechanism may be updated to the computer automatically. The edge ring identifier is used to link the edge ring to a slot identifier of the slot within the edge ring carrier into which the edge ring is inserted. This link provides information on a location of the edge ring within the carrier. The information related to the edge ring is used to generate a metadata file for the edge ring.

The edge ring is then tracked using the edge ring identifier as the edge ring is moved into and out of the edge ring carrier and into and out of a processing station within a fabrication system, as illustrated in operation 830. The edge ring may be moved from the edge ring carrier to a processing station and from one processing station to another using a different edge ring carrier. Each time the edge ring is moved, the movements are tracked using the edge ring identifier and details of the current location of the edge ring are updated to the metadata file of the edge ring. The updates to the metadata file are used to provide lifetime information of the edge ring. The lifetime information provides details of how many lifetime hours have been used and from this, life time hours that are remaining may be computed for the edge ring. Each edge ring may have a defined amount of lifetime use hours. As the edge ring is moved into a process module and is exposed to a process, the lifetime hours used increase and the lifetime hours remaining is reduced, in accordance to the amount of time taken by the process. The tracking of the edge ring continues and the lifetime hours used and remaining are determined till all the lifetime hours have been used or close to being used. This information may be used to determine which process module the edge ring that needs to be replaced is and when the edge ring needs to be replaced.

The lifetime use information provided from the tracking may also be used to analyze the conditions within the fabrication system to detect when an error occurred and to pinpoint where the error occurred and what condition caused the error, so that appropriate measures can be taken to address the error. The automated uploading and tracking also addresses the common errors that may be encountered due to human interaction, such as double slotting or cross slotting of an edge ring within an edge ring carrier. Other advantages of the various implementations will become apparent to one skilled in the art after reading the various implementations described herein.

The foregoing description of the various implementations has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A method for tracking an edge ring, comprising:
capturing an edge ring identifier from a source related to the edge ring;
inserting the edge ring to a slot of an edge ring carrier, the edge ring being assigned to the edge ring carrier; and tracking the edge ring identifier for transfers into and out of the edge ring carrier and into and out of a processing station,
   wherein tracking of the edge ring identifier builds a metadata file that provides lifetime information regarding the edge ring.

2. The method of claim 1, wherein the source is a surface of the edge ring, or a part embedded within the edge ring, or a surface of a package holding the edge ring.

3. The method of claim 1, wherein inserting the edge ring includes linking the edge ring identifier to a slot identifier of the slot and to a carrier identifier of the edge ring carrier.

4. The method of claim 1, wherein the capturing and inserting operations are performed during a time when the edge ring is being loaded to the edge ring carrier.

5. The method of claim 1, wherein tracking the edge ring identifier includes receiving information captured by one or more sensors of the edge ring carrier as the edge ring is moved into and out of a specific slot of the edge ring carrier, the information received from the one or more sensors used to update the lifetime information in the metadata file of the edge ring.

6. The method of claim 5, wherein the information received from the one or more sensors of the edge ring carrier are used to update a content table and a state table maintained for the edge ring carrier.

7. The method of claim 1, wherein tracking the edge ring identifier includes receiving information captured by one or more sensors distributed within the processing station as the edge ring moves within the processing station of a fabrication system, the information received from the one or more sensors used to update the lifetime information in the metadata file of the edge ring.

8. The method of claim 7, wherein the processing station includes one or more of a load port, an atmospheric transfer module, a loadlock chamber, a vacuum transfer module, a process module in which the edge ring is used, or one or more robots that move the edge ring within the processing station, and
   wherein the information received from the one or more sensors includes one or more of a location of the edge ring, a time when the edge ring is introduced into the location, a time when the edge ring is removed from the location, a condition of the edge ring before moving to the location, the condition of the edge ring after moving out of the location, an intended tool of use for the edge ring, an intended process module of use for the edge ring, or an usage record of the edge ring within the process module.

9. The method of claim 1, wherein tracking the edge ring identifier further includes, querying a part tracking database maintained in a fabrication system in which the processing station is located, to obtain current location of the edge ring and updating the metadata file with the current location.

10. The method of claim 1, wherein tracking the edge ring identifier further includes,
   detecting selection of the edge ring for transferring out of the edge ring carrier;
   querying a part tracking database maintained in a fabrication system to determine a current location of the edge ring carrier holding the edge ring, within the fabrication system;
   when the current location of the edge ring carrier is at a load port of the processing station, verifying that the edge ring associated with the edge ring identifier is an edge ring used in a process module within the processing station, the verification used to allow the transfer of the edge ring out of the edge ring carrier.

11. The method of claim 10, when the verification determines that the edge ring is not being used in the process module, generating an alarm to indicate a mismatch in the edge ring selected for transferring out of the edge ring carrier and prevent transfer of the edge ring out of the edge ring carrier.

12. The method of claim 1, wherein tracking the edge ring identifier further includes,
   detecting selection of the edge ring for transferring out of the edge ring carrier;
   querying a part tracking database maintained in a fabrication system to determine a current location of the edge ring carrier holding the edge ring, within the fabrication system;
   when the current location of the edge ring carrier is at a load port of the processing station, verifying that the edge ring associated with the edge ring identifier is an edge ring used in a process module within the processing station;
   analyzing lifetime information of the edge ring provided in the metadata file to determine lifetime use remaining for the edge ring, the analyzing used to allow transfer of the edge ring out of the edge ring carrier when the lifetime use remaining is sufficient to undergo a fabrication operation within the process module in the processing station.

13. The method of claim 12, when the lifetime use remaining for the edge ring is not sufficient for performing at least one round of the fabrication operation in the process module, generating an alarm to indicate that the edge ring selected for transferring into the process module has insufficient remaining lifetime use, and prevent transfer of the edge ring out of the edge ring carrier into the process module in the processing station.

14. The method of claim 1, wherein tracking the edge ring identifier associated with the edge ring includes analyzing lifetime information of the edge ring provided in the metadata file to determine lifetime use remaining for the edge ring, the lifetime use used to determine when the edge ring needs to be removed from the processing station.

15. A system for tracking an edge ring, comprising:
   an edge ring execution system configured to track the edge ring within the system, the edge ring execution system interacting with,
      an edge ring tracking module to receive an edge ring identifier of the edge ring when the edge ring is received into the system and loaded onto an edge ring carrier, the edge ring assigned to the edge ring carrier;
      an edge ring carrier tracking module to track a location of the edge ring carrier as the edge ring carrier moves within the system, information provided by the edge ring carrier tracking module used to determine a current location of the edge ring within the system; and
   a manufacturing execution system configured to provide information of the edge ring as the edge ring is moved into and out of the edge ring carrier and into and out of a processing station within the system, the information provided by the manufacturing execution system used by the edge ring execution system to build a metadata file for the edge ring, wherein the metadata file provides lifetime information of the edge ring within the system.

16. The system of claim 15, wherein the edge ring execution system is distinct from the manufacturing execution system, and wherein the edge ring execution system executes on a first server and the manufacturing execution system executes on a second server within the system, the first server being communicatively connected to the second server to exchange information related to the edge ring for building the metadata file for the edge ring.

17. The system of claim 16, wherein the first server and the second server are cloud-based servers.

18. The system of claim 15, wherein the edge ring execution system is integrated with the manufacturing execution system, and wherein the manufacturing execution system configured to execute on a server within the system.

19. The system of claim 15, wherein the edge ring execution system is configured to assign the edge ring to the edge ring carrier by linking the edge ring identifier to a carrier identifier of the edge ring carrier and to a slot identifier of a slot within the edge ring carrier into which the edge ring is loaded.

20. The system of claim 15, wherein the edge ring carrier includes one or more sensors to track the edge ring using the edge ring identifier as the edge ring is moved into and out of the edge ring carrier, information provided by the one or more sensors within the edge ring carrier is processed by the manufacturing execution system to provide updates to the metadata file of the edge ring maintained by the edge ring execution system.

21. The system of claim 15, wherein the processing station includes a plurality of modules and one or more sensors distributed within the plurality of modules, information provided by the one or more sensors within the processing system is processed by the manufacturing execution system to provide updates to the metadata file of the edge ring maintained by the edge ring execution system.

* * * * *